United States Patent
Muhammad et al.

(10) Patent No.: US 7,356,069 B2
(45) Date of Patent: Apr. 8, 2008

(54) SPREAD SPECTRUM DEMODULATION USING A SUBSAMPLING COMMUNICATION RECEIVER ARCHITECTURE

(75) Inventors: Khurram Muhammad, Richardson, TX (US); Carl M. Panasik, Garland, TX (US); Dirk Leipold, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 953 days.

(21) Appl. No.: 10/132,624

(22) Filed: Apr. 25, 2002

(65) Prior Publication Data

US 2002/0172170 A1   Nov. 21, 2002

Related U.S. Application Data

(63) Continuation-in-part of application No. 10/099,831, filed on Mar. 15, 2002.

(60) Provisional application No. 60/286,421, filed on Apr. 25, 2001, provisional application No. 60/286,564, filed on Apr. 25, 2001, provisional application No. 60/286,736, filed on Apr. 25, 2001, provisional application No. 60/286,787, filed on Apr. 25, 2001, provisional application No. 60/286,788, filed on Apr. 25, 2001, provisional application No. 60/343,653, filed on Dec. 28, 2001, provisional application No. 60/344,262, filed on Dec. 28, 2001, provisional application No. 60/343,938, filed on Dec. 28, 2001, provisional application No. 60/343,673, filed on Dec. 29, 2001.

(51) Int. Cl.
*H04B 1/707* (2006.01)
(52) U.S. Cl. ...................................... 375/140
(58) Field of Classification Search ............... 375/140, 375/147, 151, 153
See application file for complete search history.

(56) References Cited

U.S. PATENT DOCUMENTS

| | | | |
|---|---|---|---|
| 6,438,366 B1 * | 8/2002 | Lindfors et al. | 455/334 |
| 6,879,817 B1 * | 4/2005 | Sorrells et al. | 455/296 |
| 2001/0053174 A1 * | 12/2001 | Fleming et al. | 375/130 |

OTHER PUBLICATIONS

Copending U.S. Appl. No. 09/828,338, filed Apr. 6, 2001.
Copending U.S. Appl. No. 09/850,435, filed May 7, 2001.

* cited by examiner

*Primary Examiner*—Kevin Kim
(74) *Attorney, Agent, or Firm*—Ronald O. Neerings; Wade James Brady, III; Frederick J. Telecky, Jr.

(57) ABSTRACT

A first periodic voltage waveform (20) is downconverted into a second periodic voltage waveform (35, 36). A plurality of temporally distinct samples (SA1, SA2, . . . ) respectively indicative of areas under corresponding fractional cycles of the first voltage waveform are obtained. The samples are obtained in response to a control signal indicative of a code used to produce the first voltage waveform, and the samples are combined to produce the second voltage waveform.

40 Claims, 23 Drawing Sheets

FIG. 5

| SAMPLE | SWITCHES CLOSED |
|---|---|
| SA1 | S1 AND R8 |
| SA2 | S5 AND R1 |
| SA3 | S2 AND R5 |
| SA4 | S6 AND R2 |
| SA5 | S3 AND R6 |
| SA6 | S7 AND R3 |
| SA7 | S4 AND R7 |
| SA8 | S8 AND R4 |
| SA9 | S1 AND R8 |
| SA10 | S5 AND R1 |
| SA11 | S2 AND R5 |
| ⋮ | ⋮ |

FIG. 5A

| SAMPLE | SWITCHES CLOSED FOR SAMPLING | SWITCHES CLOSED FOR READ OUT |
|---|---|---|
| SA1 | S1 | R3,R4,R7,R8 |
| SA2 | S5 | –do– |
| SA3 | S2 | –do– |
| SA4 | S6 | –do– |
| SA5 | S3 | R1,R2,R5,R6 |
| SA6 | S7 | –do– |
| SA7 | S4 | –do– |
| SA8 | S8 | –do– |
| SA9 | S1 | R3,R4,R7,R8 |
| SA10 | S5 | –do– |
| ⋮ | ⋮ | ⋮ |

FIG. 5B

| SAMPLE | SWITCHES CLOSED |
|---|---|
| SA1 | S1 AND R7, R8 |
| SA2 | S2 AND R7, R8 |
| SA3 | S5 AND R1, R2 |
| SA4 | S6 AND R1, R2 |
| SA5 | S3 AND R5, R6 |
| SA6 | S4 AND R5, R6 |
| SA7 | S7 AND R3, R4 |
| SA8 | S8 AND R3, R4 |
| SA9 | S1 AND R7, R8 |
| SA10 | S2 AND R7, R8 |
| SA11 | S5 AND R1, R2 |
| SA12 | S6 AND R1, R2 |
| ⋮ | ⋮ |

| SAMPLE | SWITCHES CLOSED |
|---|---|
| SA1 | S1 AND R4 AND R8 |
| SA2 | S5 AND R8 |
| SA3 | S1 |
| SA4 | S5 AND R1 |
| SA5 | S2 AND R1 AND R5 |
| SA6 | S6 AND R5 |
| SA7 | S2 |
| SA8 | S6 AND R2 |
| SA9 | S3 AND R2 AND R6 |
| SA10 | S7 AND R6 |
| SA11 | S3 |
| SA12 | S7 AND R3 |
| SA13 | S4 AND R3 AND R7 |
| SA14 | S8 AND R7 |
| SA15 | S4 |
| SA16 | S8 AND R4 |
| SA17 | S1 AND R4 AND R8 |
| SA18 | S5 AND R8 |
| SA19 | S1 |
| SA20 | S5 AND R1 |
| SA21 | S2 AND R1 AND R5 |
| ⋮ | ⋮ |

*FIG. 6*

| SAMPLE | SWITCHES CLOSED FOR SAMPLING | SWITCHES CLOSED FOR READ OUT |
|---|---|---|
| SA1 | S1 | R3,R4,R7,R8 |
| SA2 | S5 | –do– |
| SA3 | S1 | –do– |
| SA4 | S5 | –do– |
| SA5 | S2 | –do– |
| SA6 | S6 | –do– |
| SA7 | S2 | –do– |
| SA8 | S6 | –do– |
| SA9 | S3 | R1,R2,R5,R6 |
| SA10 | S7 | –do– |
| SA11 | S3 | –do– |
| SA12 | S7 | –do– |
| SA13 | S4 | –do– |
| SA14 | S8 | –do– |
| SA15 | S4 | –do– |
| SA16 | S8 | –do– |
| SA17 | S1 | R3,R4,R7,R8 |
| SA18 | S5 | –do– |
| SA19 | S1 | –do– |
| SA20 | S5 | –do– |
| ⋮ | ⋮ | ⋮ |

*FIG. 6A*

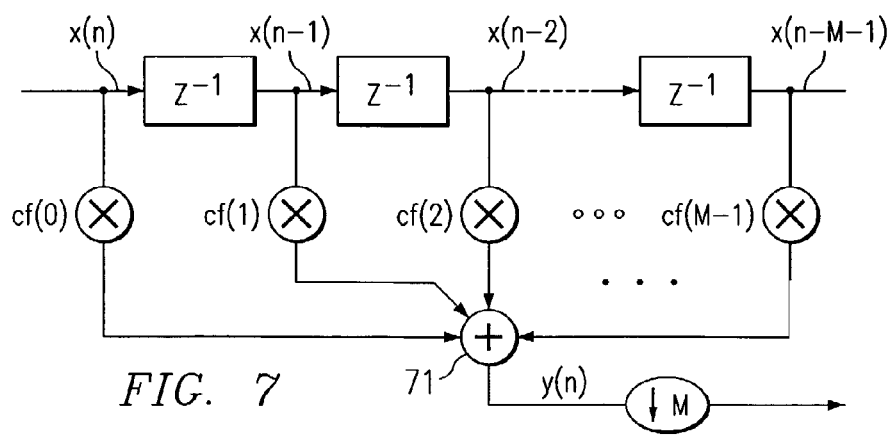

*FIG. 7*

| SAMPLE | SWITCHES CLOSED |
|---|---|
| SA1 | S1,S2,R4 AND R7 |
| SA2 | S5,S6,R1 AND R8 |
| SA3 | S3,S4,R2 AND R5 |
| SA4 | S7,S8,R6 AND R3 |
| SA5 | S1,S2,R4 AND R7 |
| SA6 | S5,S6,R8 AND R1 |
| SA7 | S3,S4,R2 AND R5 |
| SA8 | S7,S8,R6 AND R3 |
| ⋮ | ⋮ |

| SAMPLE | SWITCHES CLOSED FOR SAMPLING | SWITCHES CLOSED FOR READ OUT |
|---|---|---|
| SA1 | S1 | R5',R6,R7,R8' |
| SA2 | S9 | -do- |
| SA3 | S2 | -do- |
| SA4 | S10 | -do- |
| SA5 | S3 | R7',R8,R1,R2' |
| SA6 | S11 | -do- |
| SA7 | S4 | -do- |
| SA8 | S12 | -do- |
| SA9 | S5 | R1',R2,R3,R4' |
| SA10 | S13 | -do- |
| SA11 | S6 | -do- |
| SA12 | S14 | -do- |
| SA13 | S7 | R3',R4,R5,R6' |
| SA14 | S15 | -do- |
| SA15 | S8 | -do- |
| SA16 | S16 | -do- |
| SA17 | S1 | R5',R6,R7,R8' |
| SA18 | S9 | -do- |
| SA19 | S2 | -do- |
| SA20 | S10 | -do- |
| ⋮ | ⋮ | ⋮ |

| SAMPLE | S1–S8 CLOSED | R1 AND R2 CLOSED | R3 CLOSED | SH1–SH8 CLOSED |
|---|---|---|---|---|
| SA1 | B1 | — | — | — |
| SA2 | B5 | B1 | — | — |
| SA3 | B2 | B5 | B1 | — |
| SA4 | B6 | B2 | B5 | B1 |
| SA5 | B3 | B6 | B2 | B5 |
| SA6 | B7 | B3 | B6 | B2 |
| SA7 | B4 | B7 | B3 | B6 |
| SA8 | B8 | B4 | B7 | B3 |
| SA9 | B1 | B8 | B4 | B7 |
| SA10 | B5 | B1 | B8 | B4 |
| SA11 | B2 | B5 | B1 | B8 |
| SA12 | B6 | B2 | B5 | B1 |
| ⋮ | ⋮ | ⋮ | ⋮ | ⋮ |

$(1/4)x(n)+(1/8)x(n-1)$

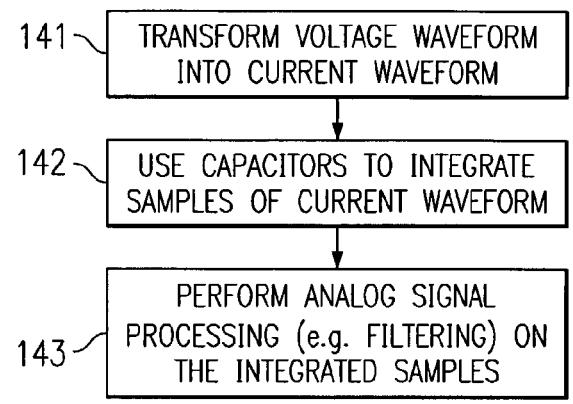
FIG. 14
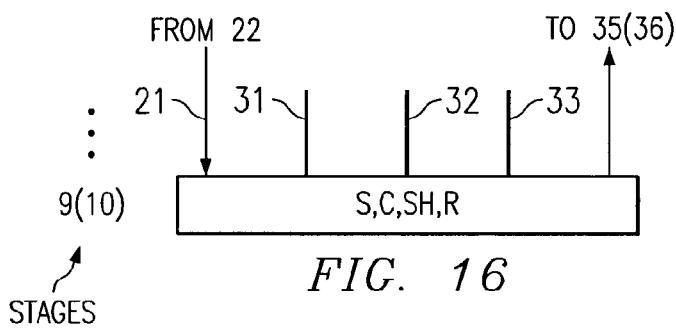
FIG. 16
| SAMPLES | SWITCHES CLOSED |
|---|---|
| SA1,SA3,...SA17 | S1 |
| SA19,SA21,...SA35 | S2 AND R1 |
| SA37,SA39,...SA53 | S3 AND R1,R2 |
| SA55,SA57,...SA71 | S4 |
| SA73,SA75,...SA89 | S1 AND R2,R3,R4 |
| SA91,SA93,...SA107 | S2 AND R1,R3,R4 |
| SA109,SA111,...SA125 | S3 AND R1,R2,R4 |
| SA127,SA129,...SA143 | S4 |
| SA145,SA149,...SA161 | S1 AND R2,R3,R4 |
| ⋮ | ⋮ |
FIG. 18

| SAMPLE | SWITCHES CLOSED |
|---|---|
| SA1 | S1 |
| SA3 | S2 |
| SA5 | S3 |
| SA7 | S1 |
| SA9 | S2 |
| SA11 | S3 |
| SA13 | S1 |
| SA15 | S2 |
| SA17 | S3 |
| SA19 | S4 AND R1 |
| SA21 | S2 AND R1 |
| SA23 | S3 AND R1 |
| SA25 | S4 AND R1 |
| SA27 | S2 AND R1 |
| SA29 | S3 AND R1 |
| SA31 | S4 AND R1 |
| SA33 | S2 AND R1 |
| SA35 | S3 AND R1 |
| SA37 | S4 AND R2 |
| SA39 | S1 AND R2 |
| SA41 | S3 AND R2 |
| SA43 | S4 AND R2 |
| SA45 | S1 AND R2 |
| SA47 | S3 AND R2 |
| SA49 | S4 AND R2 |
| SA51 | S1 AND R2 |
| SA53 | S3 AND R2 |
| SA55 | S4 AND R3 |
| SA57 | S1 AND R3 |
| SA59 | S2 AND R3 |
| SA61 | S4 AND R3 |
| SA63 | S1 AND R3 |
| SA65 | S2 AND R3 |
| SA67 | S4 AND R3 |
| SA69 | S1 AND R3 |
| SA71 | S2 AND R3 |
| SA73 | S3 AND R4 |
| SA75 | S1 AND R4 |
| SA77 | S2 AND R4 |
| SA79 | S3 AND R4 |
| SA81 | S1 AND R4 |
| SA83 | S2 AND R4 |
| SA85 | S3 AND R4 |
| SA87 | S1 AND R4 |
| SA89 | S2 AND R4 |

FIG. 15B

| SA91 | S3 AND R1 |
|---|---|
| SA93 | S4 AND R1 |
| SA95 | S2 AND R1 |
| SA97 | S3 AND R1 |
| SA99 | S4 AND R1 |
| SA101 | S2 AND R1 |
| SA103 | S3 AND R1 |
| SA105 | S4 AND R1 |
| SA107 | S2 AND R1 |
| SA109 | S3 AND R2 |
| SA111 | S4 AND R2 |
| SA113 | S1 AND R2 |
| SA115 | S3 AND R2 |
| SA117 | S4 AND R2 |
| SA119 | S1 AND R2 |
| SA121 | S3 AND R2 |
| SA123 | S4 AND R2 |
| SA125 | S1 AND R2 |
| SA127 | S2 AND R3 |
| SA129 | S4 AND R3 |
| SA131 | S1 AND R3 |
| SA133 | S2 AND R3 |
| SA135 | S4 AND R3 |
| SA137 | S1 AND R3 |
| SA139 | S2 AND R3 |
| SA141 | S4 AND R3 |
| SA143 | S1 AND R3 |
| SA145 | S2 AND R4 |
| SA147 | S3 AND R4 |
| SA149 | S1 AND R4 |
| SA151 | S2 AND R4 |
| SA153 | S3 AND R4 |
| SA155 | S1 AND R4 |
| SA157 | S2 AND R4 |
| SA159 | S3 AND R4 |
| SA161 | S1 AND R4 |
| SA163 | S2 AND R1 |
| SA165 | S3 AND R1 |
| SA167 | S4 AND R1 |
| ⋮ | ⋮ |

FIG. 17

| FIG. 17A |
| FIG. 17B |

FIG. 17A

| SAMPLE | SWITCHES CLOSED |
|---|---|
| SA1 | S1 |
| SA3 | S2 |
| SA5 | S3 |
| SA7 | S1 |
| SA9 | S2 |
| SA11 | S3 |
| SA13 | S1 |
| SA15 | S2 |
| SA17 | S3 |
| SA19 | S4 AND R1 |
| SA21 | S2 AND R1 |
| SA23 | S3 AND R1 |
| SA25 | S4 AND R1 |
| SA27 | S2 AND R1 |
| SA29 | S3 AND R1 |
| SA31 | S4 AND R1 |
| SA33 | S2 AND R1 |
| SA35 | S3 AND R1 |
| SA37 | S4 AND R2 |
| SA39 | S1 AND R2 |
| SA41 | S3 AND R2 |
| SA43 | S4 AND R2 |
| SA45 | S1 AND R2 |
| SA47 | S3 AND R2 |
| SA49 | S4 AND R2 |
| SA51 | S1 AND R2 |
| SA53 | S3 AND R2 |
| SA55 | S4 |
| SA57 | S1 |
| SA59 | S2 |
| SA61 | S4 |
| SA63 | S1 |
| SA65 | S2 |
| SA67 | S4 |
| SA69 | S1 |
| SA71 | S2 |
| SA73 | S9 AND R3 AND R4 |
| SA75 | S1 AND R3 AND R4 |
| SA77 | S2 AND R3 AND R4 |
| SA79 | S9 AND R3 AND R4 |
| SA81 | S1 AND R3 AND R4 |
| SA83 | S2 AND R3 AND R4 |
| SA85 | S9 AND R3 AND R4 |
| SA87 | S1 AND R3 AND R4 |
| SA89 | S2 AND R3 AND R4 |

FIG. 17B

| SA91 | S9 AND R1 |
|---|---|
| SA93 | S4 AND R1 |
| SA95 | S2 AND R1 |
| SA97 | S9 AND R1 |
| SA99 | S4 AND R1 |
| SA101 | S2 AND R1 |
| SA103 | S9 AND R1 |
| SA105 | S4 AND R1 |
| SA107 | S2 AND R1 |
| SA109 | S9 AND R2 |
| SA111 | S4 AND R2 |
| SA113 | S1 AND R2 |
| SA115 | S9 AND R2 |
| SA117 | S4 AND R2 |
| SA119 | S1 AND R2 |
| SA121 | S9 AND R2 |
| SA123 | S4 AND R2 |
| SA125 | S1 AND R2 |
| SA127 | S2 |
| SA129 | S4 |
| SA131 | S1 |
| SA133 | S2 |
| SA135 | S4 |
| SA137 | S1 |
| SA139 | S2 |
| SA141 | S4 |
| SA143 | S1 |
| SA145 | S2 AND R4 AND R9 |
| SA147 | S3 AND R4 AND R9 |
| SA149 | S1 AND R4 AND R9 |
| SA151 | S2 AND R4 AND R9 |
| SA153 | S3 AND R4 AND R9 |
| SA155 | S1 AND R4 AND R9 |
| SA157 | S2 AND R4 AND R9 |
| SA159 | S3 AND R4 AND R9 |
| SA161 | S1 AND R4 AND R9 |
| SA163 | S2 AND R1 |
| SA165 | S3 AND R1 |
| SA167 | S4 AND R1 |
| ⋮ | ⋮ |

| SAMPLES | SWITCHES CLOSED |
|---|---|
| SA1, SA3, SA5, SA7 | S1 |
| SA9, SA11, SA13, SA15 | S2 and R1 |
| SA17, SA19, SA21, SA23 | S1 and R2 |
| SA25, SA27, SA29, SA31 | S2 and R1 |
| SA33, SA35, SA37, SA39 | S1 and R2 |
| SA41, SA43, SA45, SA47 | S2 and R1 |
| SA49, SA51, SA53, SA55 | S1 and R2 |
| SA57, SA59, SA61, SA63 | S2 and R1 |
| SA65, SA67, SA69, SA71 | S1 and R2 |
| • | • |
| • | • |
| • | • |

FIGURE 19A

| SAMPLES | SWITCHES CLOSED |
|---|---|
| SA1, SA3, SA5, SA7 | S1 |
| SA9, SA11, SA13, SA15 | S2 |
| SA17, SA19, SA21, SA23 | S3 and R1, R2 |
| SA25, SA27, SA29, SA31 | S1 |
| SA33, SA35, SA37, SA39 | S2 and R1, R3 |
| SA41, SA43, SA45, SA47 | S3 |
| SA49, SA51, SA53, SA55 | S1 and R2, R3 |
| SA57, SA59, SA61, SA63 | S2 |
| SA65, SA67, SA69, SA71 | S3 and R1, R2 |
| • | • |
| • | • |
| • | • |

FIGURE 19B

| SAMPLES | SWITCHES CLOSED |
|---|---|
| SA1, SA3, SA5, SA7 | S1 |
| SA9, SA11, SA13, SA15 | S1 |
| SA17, SA19, SA21, SA23 | S2 and R1 |
| SA25, SA27, SA29, SA31 | S2 (and SH1) |
| SA33, SA35, SA37, SA39 | S1 and R2 |
| SA41, SA43, SA45, SA47 | S1 (and SH2) |
| SA49, SA51, SA53, SA55 | S2 and R1 |
| SA57, SA59, SA61, SA63 | S2 (and SH1) |
| SA65, SA67, SA69, SA71 | S1 and R2 |
| ● | ● |
| ● | ● |
| ● | ● |

FIGURE 19C

| SAMPLES | SWITCHES CLOSED |
|---|---|
| SA1, SA3, SA5, SA7 | S1 |
| SA9, SA11, SA13, SA15 | S1 |
| SA17, SA19, SA21, SA23 | S2 and R1, R3 |
| SA25, SA27, SA29, SA31 | S1 |
| SA33, SA35, SA37, SA39 | S1 |
| SA41, SA43, SA45, SA47 | S3 and R1, R2 |
| SA49, SA51, SA53, SA55 | S1 |
| SA57, SA59, SA61, SA63 | S1 |
| SA65, SA67, SA69, SA71 | S2 and R1, R3 |
| SA73, SA75, SA77, SA79 | S1 |
| SA81, SA83, SA85, SA87 | S1 |
| SA89, SA91, SA93, SA95 | S3 and R1, R2 |
| • | • |
| • | • |
| • | • |

FIGURE 19D

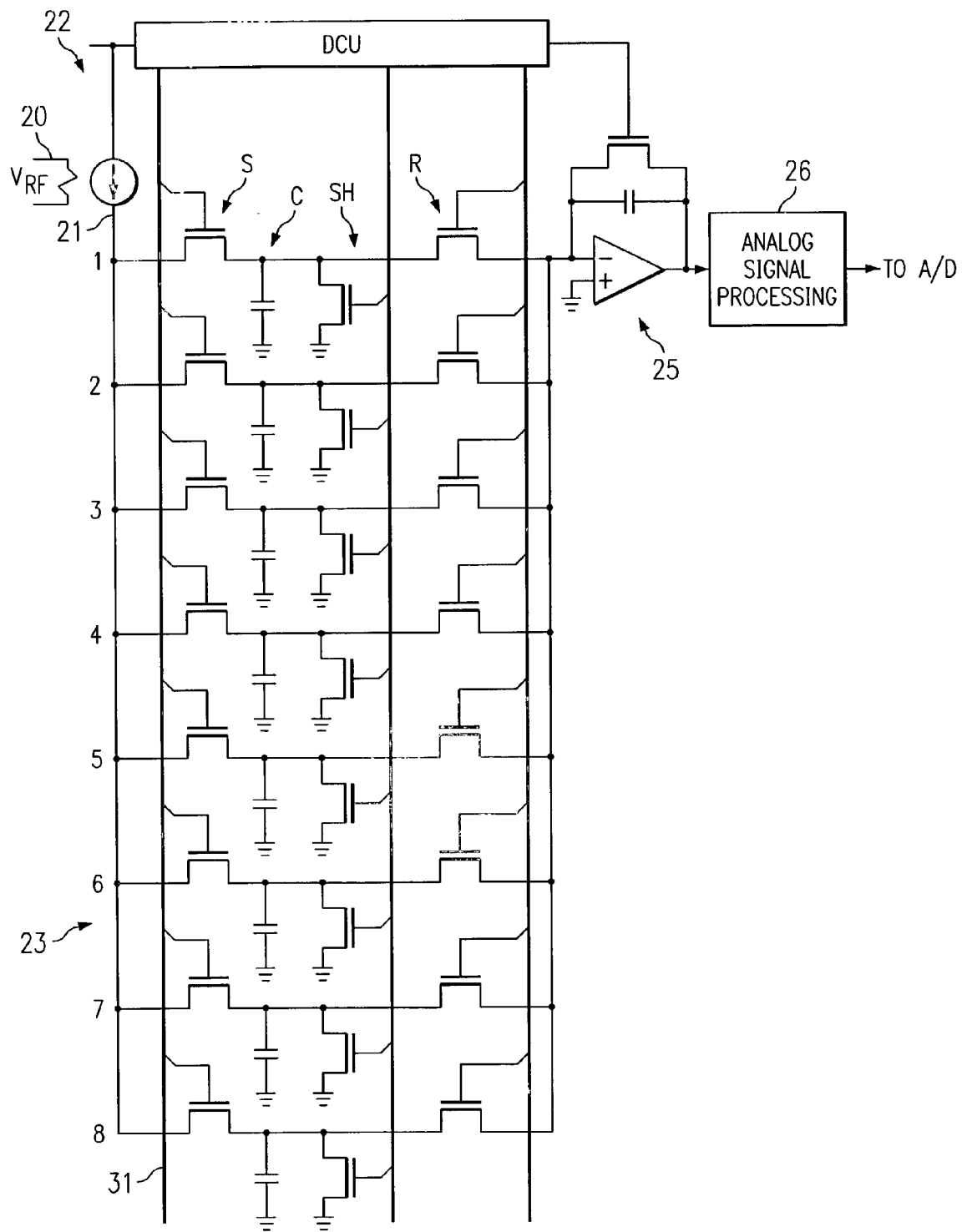

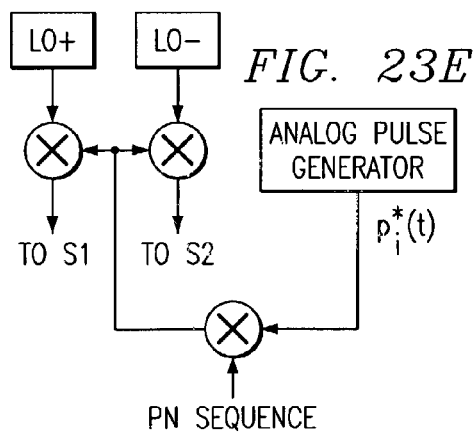
FIG. 23E
FIG. 24
| SAMPLES | SWITCHES CLOSED |
|---|---|
| SA1,SA3,...,SAJ−1 | S1 |
| SA2,SA4,...,SAJ | S2 |
| SAJ+1,...,SA2J−1 | S3 AND R1 AND R2 |
| SAJ+2,...,SA2J | S4 AND R1 AND R2 |
| SA2J+1,...,SA3J−1 | S1 AND R3 AND R4 |
| SA2J+2,...,SA3J | S2 AND R3 AND R4 |
| SA3J+1,...,SA4J−1 | S3 AND R1 AND R2 |
| ⋮ | ⋮ |
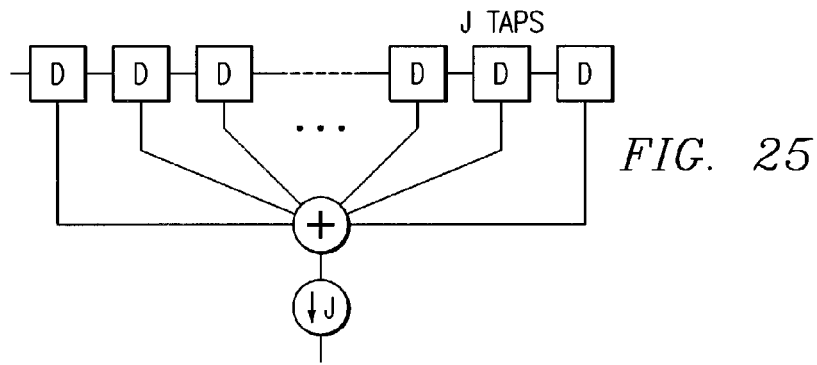
FIG. 25
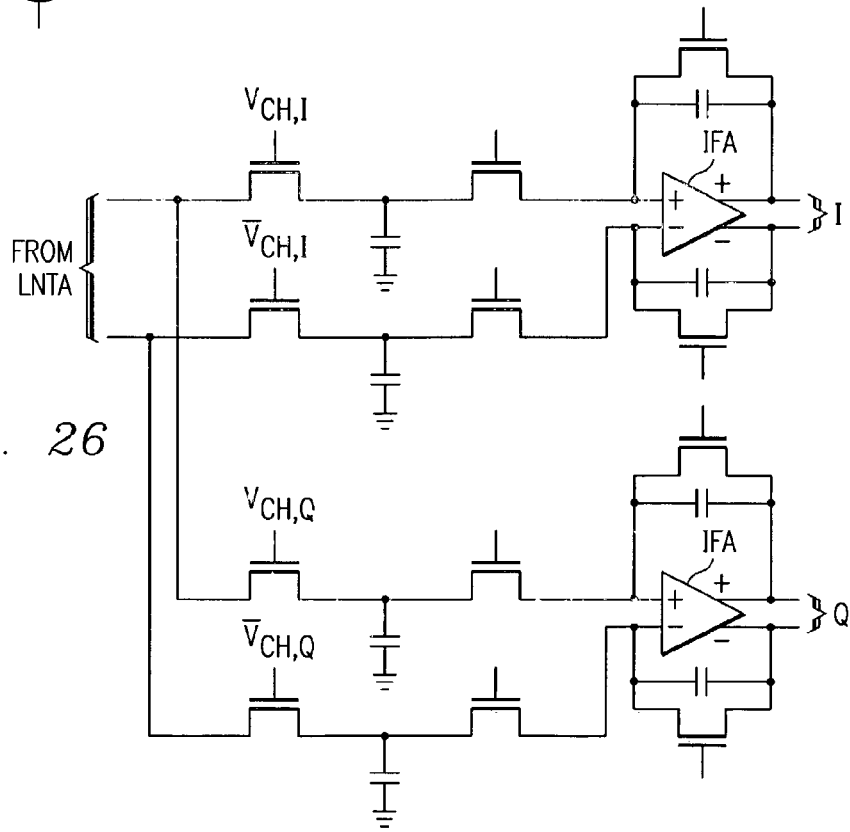
FIG. 26

SPREAD SPECTRUM DEMODULATION USING A SUBSAMPLING COMMUNICATION RECEIVER ARCHITECTURE

The present application is a continuation-in-part of U.S. Ser. No. 10/099,831 filed on Mar. 15, 2002, and the present application claims the priority under 35 USC 119(e)(1) of the following U.S. provisional applications: 60/286,421, 60/286,564, 60/286,736, 60/286,787, and 60/286,788, all filed on Apr. 25, 2001; and 60/343,653, 60/344,262, 60/343,938, all filed on Dec. 28, 2001 and 60/343,673 filed Dec. 29, 2001. The present application discloses subject matter that is related to subject matter disclosed in U.S. Ser. Nos. 10/132,436 and 10/132,025, both filed concurrently herewith. All of the aforementioned applications are incorporated herein by reference.

FIELD OF THE INVENTION

The invention relates generally to communication receivers and, more particularly, to subsampling receiver architectures.

BACKGROUND OF THE INVENTION

A recent trend in direct-conversion receivers is to use subsampling. The basic approach is to sample the RF signal at an integer fraction of the carrier frequency greater than twice the bandwidth of the modulating signal. Spectral images of the modulating signals are repeated and down-conversion can be achieved by a low pass filter.

A general scheme based on subsampling operation is presented in D. H. Shen et al., "A 900-MHz RF front-end with integrated discrete-time filtering," IEEE JSSC, Vol.31, pp. 1945-1954, December 1996 (hereinafter Shen), and is shown in FIG. 1. The RF input is sampled-and-held and followed directly by discrete time analog signal processing. The baseband signal is converted using an A/D converter. Sampling the carrier frequency $f_c$ at a rate $f_s$ results in spectral images located at $nf_s \pm f_c$ where n is an integer. A desired spectral image can be filtered using a discrete time analog filter. In this approach, the lowest power solution would involve a tradeoff analysis between the input rate of the A/D converter and the complexity of anti-aliasing filters (see Shen) by appropriate selection of $f_s$ in relation with $f_c$. In this approach, channel select filtering, demodulation and baseband processing are done in the digital domain following the A/D converter. The final stages of the multi-stage analog filters can also be used to reduce the adjacent channel interferers, thereby reducing the dynamic range requirement and power dissipation of the A/D converter.

E. Cijvat et al, "A 1.8 GHz subsampling CMOS down-coversion circuit for integrated radio applications," ISCAS 1998, Vol. 3, pp. 149-152, discloses a subsampling mixer implemented for 1.8 GHz RF system. The mixer is implemented using a track-and-hold circuit. A differential OTA is used to transfer the sampled charge to the output in order to cancel the charge feed-through and to attain high linearity. The speed of OTA determines the maximum $f_s$.

Another example of the subsampling approach is disclosed in A. Rofourgaran et al., "A single-chip 900-MHz spread-spectrum wireless transceiver in 1 μm CMOS. II. Receiver design," IEEE JSSC, Vol. 33, pp. 535-547, April 1998, for a short-distance wireless binary FSK transceiver at 900 MHz. This approach substantially reduces power dissipation by hard-limiting the filtered output of a subsampling mixer. The high frequency images are rejected by −60 dB using a switched capacitor analog filter. The limiter serves to act as a 1-bit A/D converter which provides an over-sampled down-converted baseband signal. The signal is decoded using a 1-bit FSK demodulator. The AGC functionality is achieved using the filter, limiter and demodulator. This structure is simpler than the general architecture that typically requires a multibit A/D converter and VGAs, and thereby saves power. However, its application is not directly extendable to general modulation schemes.

Conventional subsampling receiver designs eliminate the need for IF filters, image-reject mixers, image reject filters and analog I/Q branches, thereby permitting a high level of integration. Further, the LO (local oscillator) in such designs operates at a much lower frequency than $f_c$. However, this design trades one set of problems for another. Exemplary disadvantages in such receivers typically include sensitivity to clockjitter and poor linearity.

Conventional receivers based on the subsampling principle require sample-and-hold (S/H) or track-and-hold stages operating at the IF rate. The signal-to-noise ration of such stages are limited by the clock jitter and settling time requirement of the S/H. Such stages cannot practically operate at RF frequencies because the required power dissipation will be prohibitively large for the required dynamic range performance (dictating quick settling time) and sampling frequency (dictating frequency aliasing).

It is therefore desirable to provide a subsampling receiver architecture that avoids problems such as those mentioned above with respect to the prior art.

A subsampling receiver architecture according to the invention can advantageously avoid problems such as mentioned above in the down conversion of a first periodic voltage waveform into a second periodic voltage waveform. A plurality of temporally distinct samples respectively indicative of areas under corresponding fractional cycles of the first voltage waveform are obtained, in response to a control signal indicative of a code used to produce the first voltage waveform. The samples are combined to produce the second voltage waveform. In some embodiments, the code is a spreading code, the first waveform is a spread spectrum signal, and the sampling process provides inner product information that supports demodulation of the spread spectrum signal.

BRIEF DESCRIPTION OF THE DRAWINGS

FIGS. 5, 5A and 5B illustrate in tabular format examples of how the digital control unit of FIG. 3 can control the switches of FIG. 3.

FIGS. 6 and 6A illustrate in tabular format further examples of how the digital control unit of FIG. 3 can control the switches of FIG. 3.

FIG. 7 diagrammatically illustrates a general example of an FIR filter which can be implemented by the embodiments of FIG. 3.

FIGS. 8 and 8A illustrate in tabular format examples of how the digital control unit of FIG. 3 can control the switches of FIG. 3 to implement desired FIR filter functions.

FIG. 14 illustrates exemplary operations which can be performed by the embodiments of FIGS. 2-13.

FIG. 15 illustrates how FIGS. 15A and 15B are to be viewed together.

FIGS. 15A and 15B illustrate in tabular format exemplary operations which can be performed by the architecture of FIG. 3.

FIG. 16 diagrammatically illustrates exemplary embodiments of the invention which permit resetting the IF amplifier of FIG. 3.

FIG. 17 illustrates how FIGS. 17A and 17B are to be viewed together.

FIGS. 17A and 17B illustrate in tabular format exemplary operations which can be performed by the embodiments of FIG. 16.

FIG. 18 illustrates in tabular format exemplary operations which can be performed by the embodiments of FIG. 3.

FIGS. 19A, 19B, 19C and 19D illustrate in tabular format exemplary operations which can be performed by the architecture of FIG. 3 or FIG. 3A.

FIGS. 23, 23A, 23B, 23C, 23D and 23E diagrammatically illustrate further exemplary embodiments of portions of the architecture of FIG. 2.

FIG. 24 illustrates in tabular format exemplary operations which can be performed by the embodiments of FIG. 23.

FIG. 25 diagrammatically illustrates an equivalent filter produced by the operations of FIG. 24.

FIG. 26 diagrammatically illustrates exemplary embodiments of the invention that can perform I/Q mixing.

DETAILED DESCRIPTION

Figure 1:
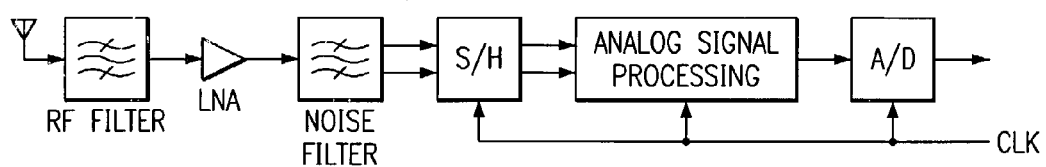
FIG. 1 diagrammatically illustrates an example of a conventional subsampling receiver architecture.
Figure 2:
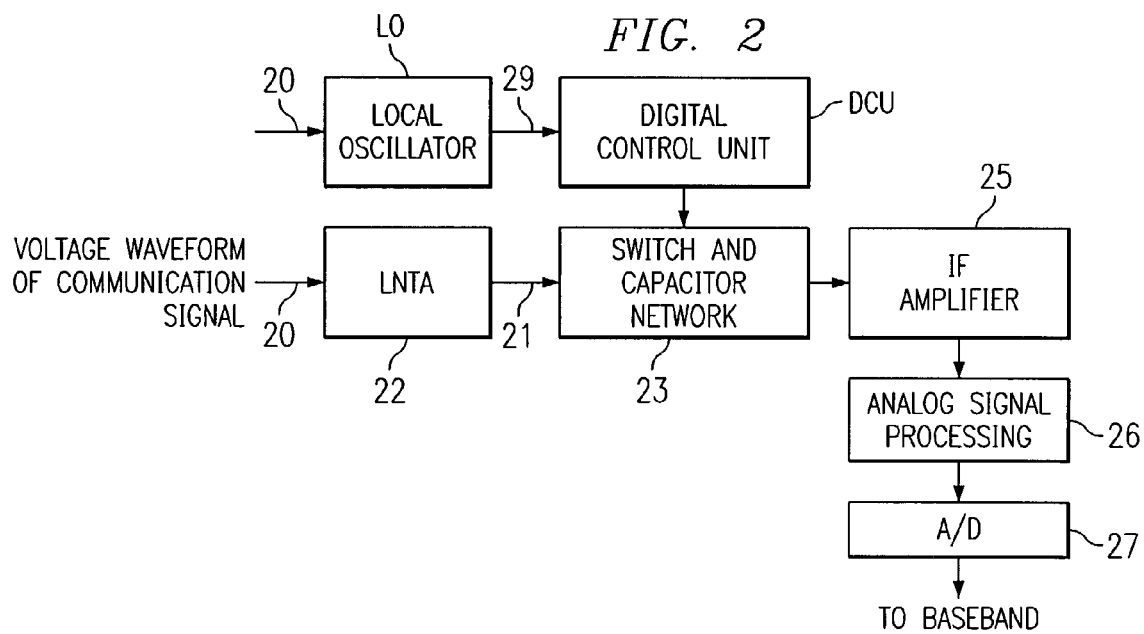
FIG. 2 diagrammatically illustrates pertinent portions of exemplary embodiments of a multi-tap digital subsampling receiver architecture according to the invention.

FIG. 2 diagrammatically illustrates pertinent portions of exemplary embodiments of a subsampling communication receiver according to the invention. The subsampling receiver architecture of FIG. 2 includes an input 20 for receiving the voltage waveform of a communications signal, for example an RF communication signal. This voltage waveform is applied to a low noise transconductance amplifier (LNTA) 22 which can use conventional techniques to transform the voltage waveform at 20 into a corresponding current waveform at 21. In some embodiments, the LNTA 22 can include a conventional low-noise amplifier (LNA) followed by a conventional transconductance amplifier (TA). The current waveform at 21 is applied to a switch and capacitor network 23. Switches in the network 23 are operable for sampling the current waveform, and capacitors in the network 23 are operable for integrating the current waveform samples. A digital control unit (DCU) controls the operation of the switches in the switch and capacitor network 23. At 29, the DCU receives oscillator signals from a local oscillator (LO). The switch and capacitor network 23 has an output for providing the aforementioned integrated current samples to an IF (intermediate frequency) amplifier 25 (also referred to as IFA) whose output drives an analog signal processing section 26, which in turn drives an A/D converter 27. The digital baseband signal output from the A/D converter 27 is passed on to a baseband processing portion of the receiver.

Figure 3:
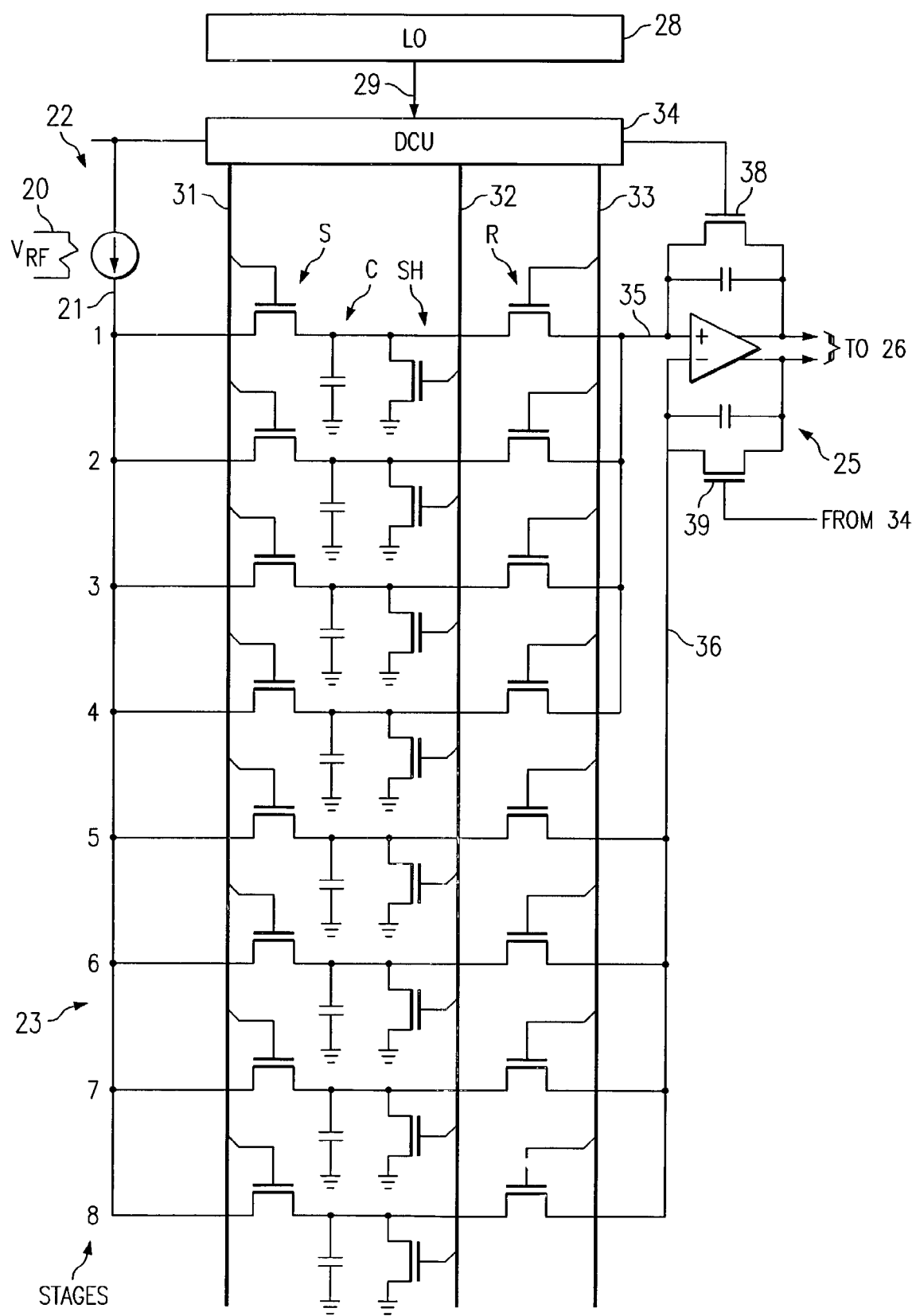
FIGS. 3 and 3A diagrammatically illustrate exemplary embodiments of portions of the multi-tap digital subsampling receiver architecture of FIG. 2.

FIG. 3 diagrammatically illustrates exemplary embodiments of pertinent portions of the receiver of FIG. 2, which portions operate to mix the input signal from a higher to lower frequency, for example, from RF to IF. In particular, FIG. 3 illustrates the LNTA 22 coupled at 21 to the switch and capacitor network 23. FIG. 3 also illustrates an exemplary DCU 34 which controls various switches (e.g., transistor switches) in the network 23 via control busses 31, 32 and 33. The switch and capacitor network 23 includes outputs which are respectively coupled to the non-inverting and inverting inputs 35 and 36 of the IF amplifier 25. The LNTA 22 (e.g. a linear LNTA) and the IF amplifier 25 can be implemented, for example, with conventionally available designs. In some embodiments, the LNTA replaces the LNA of conventional designs. In other embodiments, an LNA with a gain greater than 1 is provided upstream of the LNTA.

The switch and capacitor network 23 includes a plurality of stages (eight in the example of FIG. 3), each of which includes a sampling switch S, a capacitor C, a shorting switch SH, and a read switch R. The eight stages of the network 23 of FIG. 3 are respectively designated by the numerals 1-8. The sampling switches S are controlled by the DCU control bus 31, the shorting switches SH are controlled by the DCU bus 32, and the read switches R are controlled by the DCU bus 33. Each of the sampling switches S has an input connected at 21 to the output of the LNTA 22. Each of the sampling switches S has an output coupled to its corresponding capacitor C, and each shorting switching SH is connected for selectively shorting the terminals of its corresponding capacitor C. Each read switch R has an input connected to the output of its corresponding sampling switch S, and has an output connected to the IF amplifier 25. The read switches R of stages 1-4 have their outputs coupled to the non-inverting input 35 of the IF amplifier 25, and the read switches R of stages 5-8 have their outputs coupled to the inverting input 36 of the IF amplifier 25. The digital control unit 34 also provides control signals for controlling transistor switches 38 and 39. Switch 38 selectively shorts the terminals of a capacitor coupling the output of the IF amplifier to its non-inverting input 35, and the switch 39 selectively shorts the terminals of a capacitor which couples the output of IF amplifier 25 to its inverting input 36.

The IF amplifier 25 is shown in FIGS. 2 and 3 for illustrative purposes. However, the IF amplifier 25 can be considered as a part of the analog signal processing section 26. In some embodiments, the IF amplifier 25 can be, for example, a continuous time buffer amplifier, a switched capacitor analog baseband filter, or an impedance transformer. The switch and capacitor network 23 includes a high impedance node for sustaining a down-converted information-carrying signal which needs subsequent processing. The IF amplifier 25 operates to transfer the information to the analog signal processing section 26 with an option to filter it actively or passively while presenting it to section 26.

In some embodiments, the LNTA 22 is AC coupled to the switched capacitor network 23, and in other embodiments, the LNTA is DC coupled to the switched capacitor network 23. Capacitively coupling the LNTA output to the sampling switches S blocks DC offset build-up which could otherwise occur due to offsets in the LNTA output.

In some embodiments, the shorting switches SH of FIG. 3 can connect the top plate of the sampling capacitors C to a voltage source. Hence, each switch SH may be used to reset the initial charge on the corresponding sampling capacitor C to a predetermined value which would be the common mode voltage of the sampling capacitor C as well as the common mode input for the IF amplifier 25.

In some embodiments, the IF amplifier 25 can be used as a buffer, or may itself be a switched capacitor filtering stage which processes the data on the sampling capacitors C while simultaneously presenting that data to the analog signal processing section 26.

In some embodiments, the shorting switches SH can be used to place a common mode voltage in the network 23 while destroying the charges held on the corresponding capacitors C (that is, while resetting the charges on the corresponding capacitors).

Hereinafter, the following nomenclature will be observed. The sampling switch S of a given stage will be designated as S followed by the number of that stage. For example, S1 designates the sampling switch S of stage 1 and S5 designates the sampling switch S of stage 5. Similarly, R1 designates the read switch R of stage 1 and R6 designates the read switch R of stage 6.

Figure 3A:
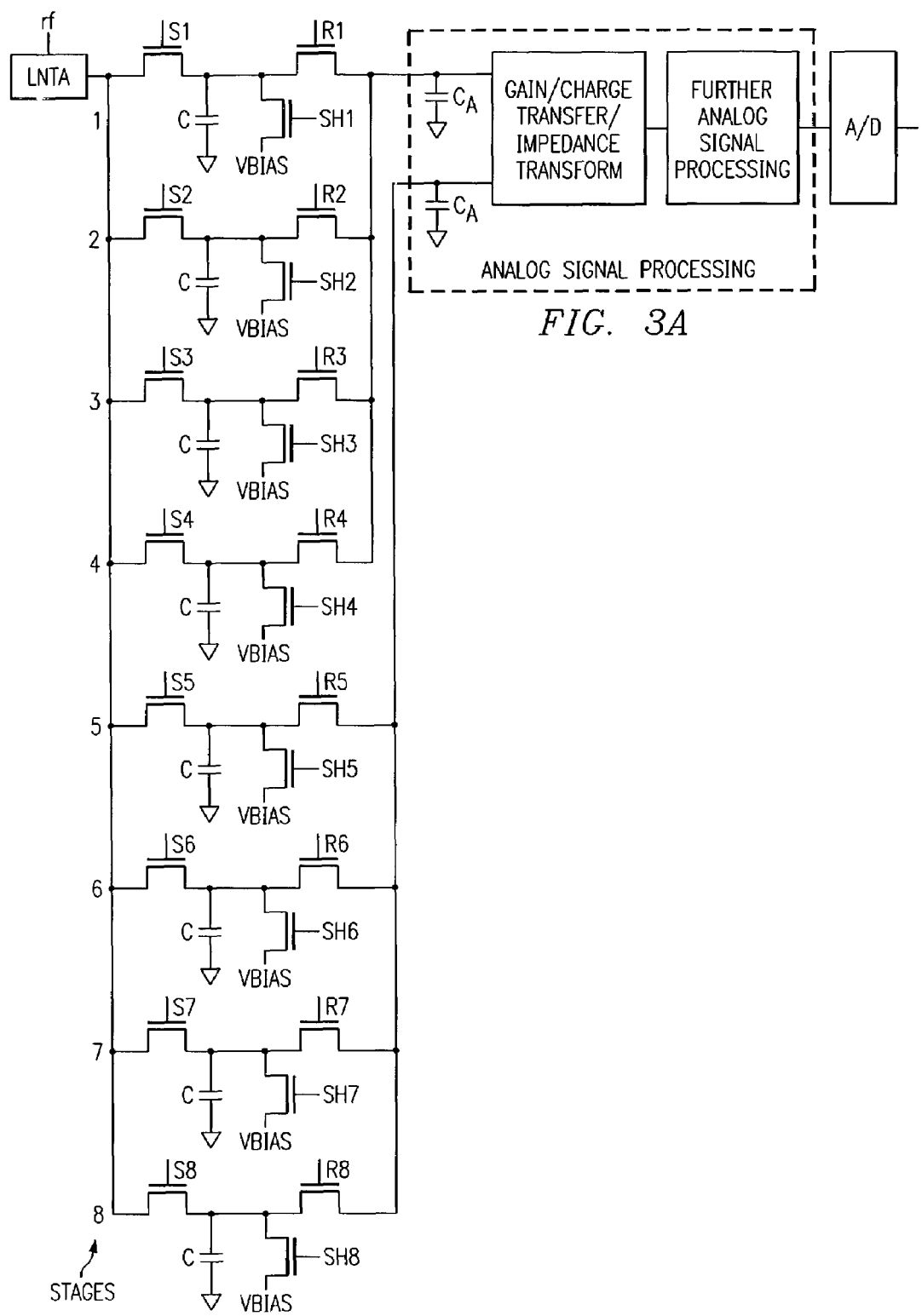

FIG. 3A demonstrates controlling the common mode voltage of one embodiment by resetting the voltage on the sampling capacitors to arbitrary VBIAS before new samples are integrated. Instead of discharging the sampling capacitors after they have been read by the IF amplifier, a predetermined voltage can be placed on them using the shorting switches SH as controlled by the DCU. This feature allows controlling the common mode voltage in this part of the receive chain by the DCU using the SH1-SH8 lines in the embodiment of FIG. 3A.

Figure 4:
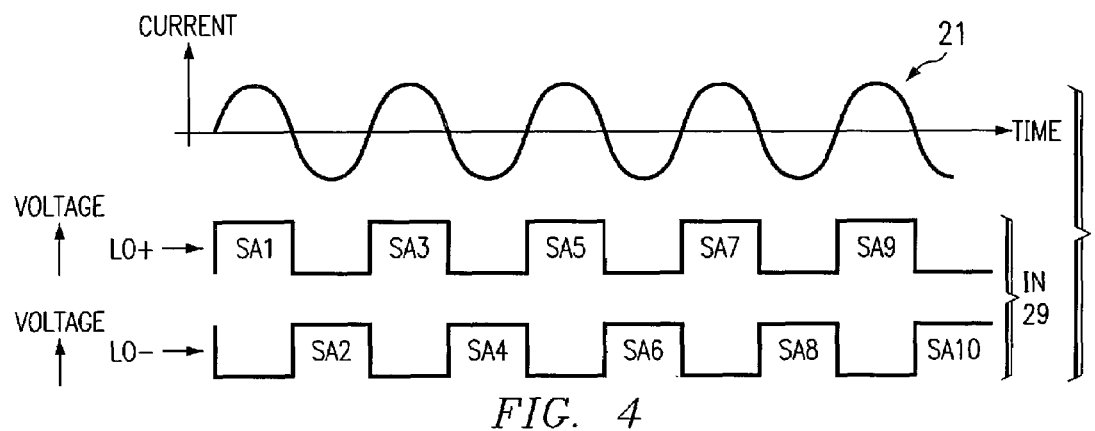
FIGS. 4 and 4A graphically illustrate exemplary signals of FIGS. 2 and 3.

FIG. 4 graphically illustrates a relationship between the local oscillator signals at 29 and the current waveform at 21 in FIG. 2. As shown in FIG. 4, the local oscillator signals 29 include a signal LO+ and a signal LO–. The signals LO+ and the LO– can be generated in conventional fashion by the local oscillator of FIG. 2 in response to the input voltage waveform 20. The signal LO+ is high during the positive half cycles of the current waveform 21, and is low during the negative half cycles, and the signal LO– is low during the positive half cycles of the current waveform 21 and high during the negative half cycles. Thus, the signal LO+ can be used to sample the positive half cycles of the current waveform, and the signal LO– can be used to sample the negative half cycles of the current waveform.

As shown in the example of FIG. 4, a first current waveform sample SA1 corresponds to a positive half cycle of the current waveform, a second current waveform sample SA2 corresponds to the immediately following negative half cycle of the current waveform 21, a third current waveform sample SA3 corresponds to the immediately following positive half cycle of the current waveform, etc. Thus, the DCU 34 can gate the signals LO+ and LO– appropriately to the control inputs of the sampling switches S in order to permit the corresponding capacitors C to integrate the portion of the current waveform (positive half cycle or negative half cycle) that is sampled by the associated sampling switch S. The DCU 34 can also gate the signals LO+ and LO– appropriately to operate the read switches R as desired to dump the stored charge from the capacitors C to the IF amplifier 25. In the example of FIG. 4, the sampling and integrating operations are performed at the Nyquist rate of the RF signal.

FIG. 5 illustrates in tabular format one example of how the DCU 34 of FIG. 3 can use signals derived from LO+ and LO– to control the sampling switches and read switches of FIG. 3. In the example of FIG. 5, the samples SA1-SA10 correspond to the current waveform 21 as shown in FIG. 4. The sample SA11 of FIG. 5 merely represents the next positive half cycle sample (not shown in FIG. 4). FIG. 5 illustrates which sampling and read switches of FIG. 3 are closed by the DCU 34 during the various sampling intervals illustrated in FIG. 4. In FIG. 5 (and also in FIGS. 5A, 5B, 6, 6A, 8, 8A, 12, 15A-15B, 17A-17B, 18, 19A, 19B and 19C) the illustrated sampling and read switches are open except during the sampling intervals indicated. The example of FIG. 5 illustrates sampling and read out at the Nyquist rate of the RF carrier signal. The IF amplifier 25 (see also FIG. 3) removes the sampled charged from the sampling capacitors C at this rate and subsequently presents it to the analog signal processing section 26.

Referring now to FIGS. 3-5, it can be seen from the example of FIG. 5 that the positive half cycles of the current waveform are integrated by the capacitors of stages 1-4, and the negative half cycles of the current waveform are integrated by the capacitors of stages 5-8. The integrated positive half cycles are sequentially read out to the non-inverting input 35 of the IF amplifier 25, and the integrated negative half cycles are sequentially read out to the inverting input 36 of the IF amplifier 25. Also in the example of FIG. 5, the positive and negative half cycles are read out to the IF amplifier alternately, in time-interleaved fashion. This provides full wave rectification. Although not explicitly shown in FIG. 5, each shorting switch SH can be operated to short the associated capacitor at any time after the charge has been read out via the corresponding read switch R and before the next closing of the corresponding sampling switch S.

The accumulation of charge flowing from the LNTA output into the sampling capacitor for half of the RF period results in direct-conversion to DC. The IF frequency of the waveform at 35, 36 can be arbitrarily changed by modifying the frequency of the local oscillator (LO) just as in conventional mixers.

Referring to FIGS. 3 and 4, because the capacitors C integrate the current waveform during an entire half cycle thereof for each sample SA1-SA10, any clock jitter in the signals LO+ and LO– (and in gated signals derived therefrom) will tend to have a relatively minor effect on the sample stored in the capacitor, because the integration operation of the capacitor determines the area beneath the waveform in the sampled half cycle. Thus, the current integration operation will typically be affected much less by clock jitter than would a conventional voltage sampling operation. The charge accumulated on a given sampling capacitor during an integration operation is manifested as a voltage on that capacitor, so the analog signal processing section 26 can use well-known conventional discrete time analog signal processing techniques to manipulate the voltages presented by the sampling capacitors.

FIG. 5A shows another example of timing generated from the DCU which relaxes the operating speed requirements of the IFA. The expression "-do-" in FIG. 5A and elsewhere means "same as above." In this example, while four samples are accumulated, four previous samples are read out to the IFA, two combined together on the positive side and two combined together on the negative side. This is an example of "spatial averaging" in which two distinct capacitors (on each side) holding different samples are read together for twice as long. Reading these two capacitors together presents the average of the two to the IFA input which performs a decimation in rate by a factor of two. This can be extended to more than two capacitors on the same side (positive or negative), so more than two samples can be spatially averaged, with the data rate decimated by the number of capacitors averaged.

FIG. 6 illustrates in tabular format another example of how the DCU 34 of FIG. 3 can control the sampling switches S and read switches R. In the example of FIG. 6, each of the capacitors of stages 1-4 integrates two successive positive half cycles of the current waveform before the capacitor is read out to the IF amplifier, and each of the capacitors of stages 5-8 integrates two successive negative half cycles of the current waveform before being read out to the IF amplifier. Thus, samples SA1 and SA3 are both integrated by the capacitor of stage 1 (via operation of sampling switch S1) before the stored charge is read out (via operation of read switch R1) during samples SA4 and SA5. Similarly, the capacitor of stage 5 integrates the negative half cycles associated with SA2 and SA4 (via operation of sampling switch S5) before being read out (via operation of read switch R5) during samples SA5 and SA6. The shorting switches SH can short the capacitors after they are read out and before they are charged again. In general, a given capacitor can integrate as many samples as desired, but it should be ensured that the charge on the capacitor does not overflow under worst case operating conditions. This includes, for example, ensuring that the largest interferer does not overload the capacitor or the input stage of the IF amplifier.

FIG. 6 demonstrates an example of a concept referred to herein as "temporal summation." In FIG. 6, on each side (positive and negative), two temporally distinct samples are accumulated on the same sampling capacitor before being read out. With the temporal summation illustrated in the example of FIG. 6, the output rate is decimated in time by a factor of two.

FIG. 6A demonstrates an example of "temporal summation and spatial averaging" where two temporally distinct samples are accumulated together on each of two sampling capacitors on each side before read out. The decimation factor is now equal to 4 in contrast to the previous examples demonstrating only temporal summation (e.g., FIG. 6) or spatial averaging (e.g., FIG. 5A), however the end result is to accumulate the average of four samples. The same end result can be obtained using temporal summation or spatial averaging exclusively (adjusting gain by scaling capacitors).

FIG. 7 diagrammatically illustrates an exemplary generalized FIR filter function which can be realized by the embodiments of FIGS. 2-4. The generalized FIR filter function of FIG. 7 includes M taps. A digital sample at time n is multiplied by a coefficient cf(0), a sample at time n−1 is multiplied by a coefficient cf(1), a sample at time n−2 is multiplied by a coefficient cf(2), and a sample a time n−M−1 is multiplied by a coefficient cf(M−1). The results of the coefficient multiplications are summed together at 71 and decimated by a factor of M at 72.

FIG. 8 illustrates in tabular format exemplary operations which can be performed by the DCU 34 of FIG. 3 to realize the following FIR filter:

$$\tfrac{1}{2}[x(n)] + \tfrac{1}{2}[x(n-1)].$$

The coefficients having a value ½ can be produced by closing two of the sampling switches S during a given sample (e.g. close S1 and S2 during SA1), thereby dividing the current from the LNTA 22 between two capacitors, each receiving ½ of the sampled current. Then, only one of the two capacitors is read out, thereby providing the desired coefficient value of ½. For example, a ½ coefficient for sample SA1 is realized by closing read switch R2 during sample SA3 (after both sample switches S1 and S2 were closed during SA1), and a ½ coefficient for sample SA2 is realized by closing read switch R5 during sample SA3 (after both sample switches S5 and S6 were closed during SA2). As discussed above, switches SH can short their respective capacitors any time between read out (if the capacitor was even read) and the next sample operation. The closing of two read switches simultaneously (e.g. R2 and R5 during SA3) provides decimation by a factor of two in this example. Other FIR filters with any desired coefficients, and any desired number of taps and decimation factor, can be implemented, for example, by providing more than 8 stages and/or varying the number of sampling switches S and read switches R that are closed during each sample. It maybe advantageous to close the same number of sampling switches S during each sample, so the LNTA sees a constant load.

FIG. 8 demonstrates an example of a concept referred to herein as "sliding window" integration. Sliding window integration is an integration technique over multiple time samples. In FIG. 8, each sample is obtained by integrating the LNTA output on two sampling capacitors, so each individual capacitor has half the voltage due to the two-way current split during integration. This spatial splitting of the sample over two distinct capacitors permits that sample to be used during two distinct read out cycles. In the example of FIG. 8, the sliding window integration technique sums two temporally distinct samples during any given read out cycle. During the next successive read out cycle, two temporally distinct samples are again summed, but with the time window shifted by one sample, so one of the samples summed in the previous read out cycle is summed again in the next read out cycle. This is illustrated, for example, by noting that sample SA1 is split between stages 1 and 2, which stages are respectively read out during samples SA2 and SA3; sample SA2 is split between stages 5 and 6, which stages are respectively read out during samples SA3 and SA4; and sample SA3 is split between stages 3 and 4, which stages are respectively read out during samples SA4 and SA5. Using the sliding window integration technique, read out operations can be performed at the Nyquist rate of the RF carrier, but with temporal summation. The sliding window concept can be extended to longer time summation windows wherein the LNTA output is integrated on any desired number of capacitors, for example all capacitors in each of two or more banks of capacitors (described in more detail below), so that charge corresponding to a given sample can be included in as many consecutive read out cycles as desired.

The sliding window integration technique can be used to construct a filter with triangular coefficients which place two-zeros on the fold-over frequencies. It is important to realize that summing samples in time is equivalent to decimating the output of a moving average (MA) filter with unity coefficients by a factor equal to the number of accumulated samples as depicted in FIG. 7.

Decimation by a factor of M results in folding of the frequency band M−1 times. The transfer function of such a filter before decimation exhibits single zeros at the frequencies which fold over to DC. The intended receiver proposes very low-IF reception or even zero-IF so that the aliasing frequencies fall either very close to (for low-IF) or exactly on the zeros (for zero-IF) and are rejected by "strategically" placed zeros.

The attenuation by a single zero many not be enough if strong interferences reside at the fold-over frequencies and it is important to increase the rejection of such frequencies by increasing the number of zeros at these fold-over frequencies. Filters with triangular coefficients place two zeros at these aliasing frequencies and provide a much stronger rejection to them. Such filters can be implemented using the sliding window integration approach. Such a filter can be constructed, for example, using any of the techniques described herein that realize fractional coefficients. In some embodiments, a predetermined fraction can be chosen based on the desired coefficient value, and the remaining charge can be discarded. Alternatively, all of the sampled charge can be retained (i.e. do not destroy unwanted charge) while still realizing triangular coefficient filtering.

Figure 8B:
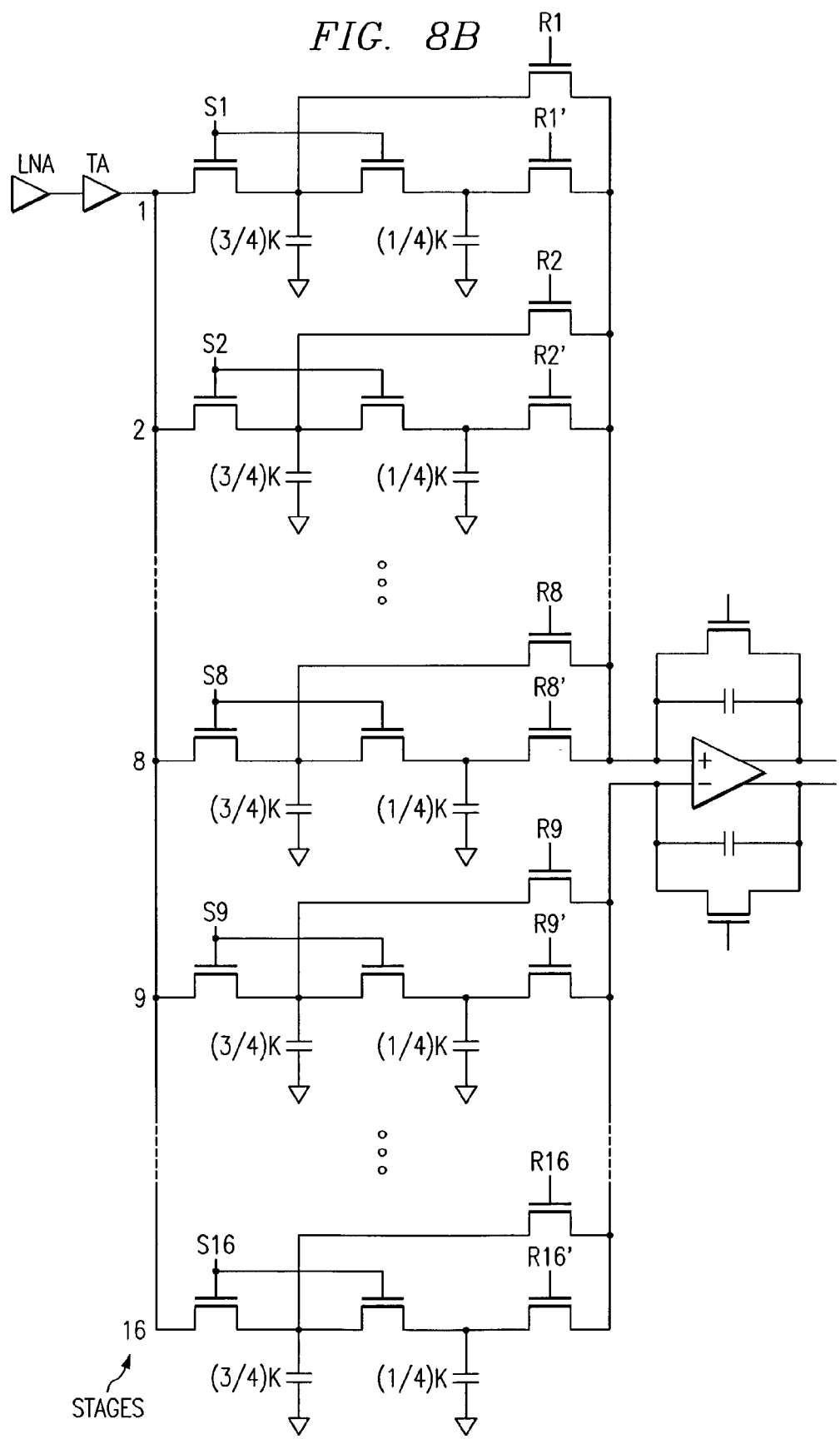
FIG. 8B diagrammatically illustrates exemplary embodiments of the invention generally similar to those of FIG. 3 but with added components for realizing triangular filter coefficients.

One exemplary embodiment of a filter realizing the triangular coefficients 1, 3, 3, 1 is shown in FIG. 8B. This structure has twice as many sampling capacitors as shown in FIG. 3 with the property that the two capacitors of each stage split the total integrating capacitance value K into fractional values of K/4 and ¾K. The read switches R1'-R16' are used to read out the K/4 samples. A total of eight sampling capacitors are seen by the plus side of the IF amplifier and the same number by the minus side. Four weighted samples are accumulated with the ratio 1:3:3:1 and read out and decimated by M/2 instead of M (M=4 in this case). FIG. 8A shows the timing for this example.

Note from FIG. 8A that the read out rate is twice as fast as the rate suggested by reading four accumulated samples, due to the sliding window integration approach. This embodiment shows spatial averaging of 4 weighted samples and provides improved rejection to the aliasing frequencies. A time accumulation of weighted samples can also be done by providing appropriate capacitor size to the LNTA in the sampling phase. However, in this approach, the LNTA will see a varying output load.

The above example may also be extended to longer time accumulation on each sampling capacitor shown in FIG. 8B. Instead of accumulating one sample on one sampling capacitor (realized as two caps which make C together and can be splitted), we can accumulate an arbitrary number of samples and move to the next capacitor. In this case, one zero will be placed to the fold-over frequencies corresponding to decimation in time on one sampling capacitor. The fold-over frequencies due to spatial averaging with weighted coefficients will see two-zeros and will be rejected by a greater amount.

Referring again to FIG. 3A, the exemplary embodiments shown therein demonstrate passive infinite impulse response (IIR) filtering obtained by charge sharing the contents of the relevant sampling capacitors (selected by DCU for read operation) with another capacitor $C_A$. The read out samples are charge shared with $C_A$ when the respective sampling capacitors are shorted with $C_A$. This splits the total charge on the aggregate of read out capacitors and previous charge on $C_A$ according to the capacitor ratio of $C_A$ to the aggregate of read out capacitors. $C_A$ is never reset, and consequently creates a low-pass filter whose pole is determined by the ratio of the aggregate of sampling capacitors shorted together with $C_A$ to the value of $C_A$. The filtered downconverted signal is transferred by an IFA or a gain block which may also be viewed as an impedance transformer and which presents this data to blocks that perform further analog signal processing.

Figure 9:
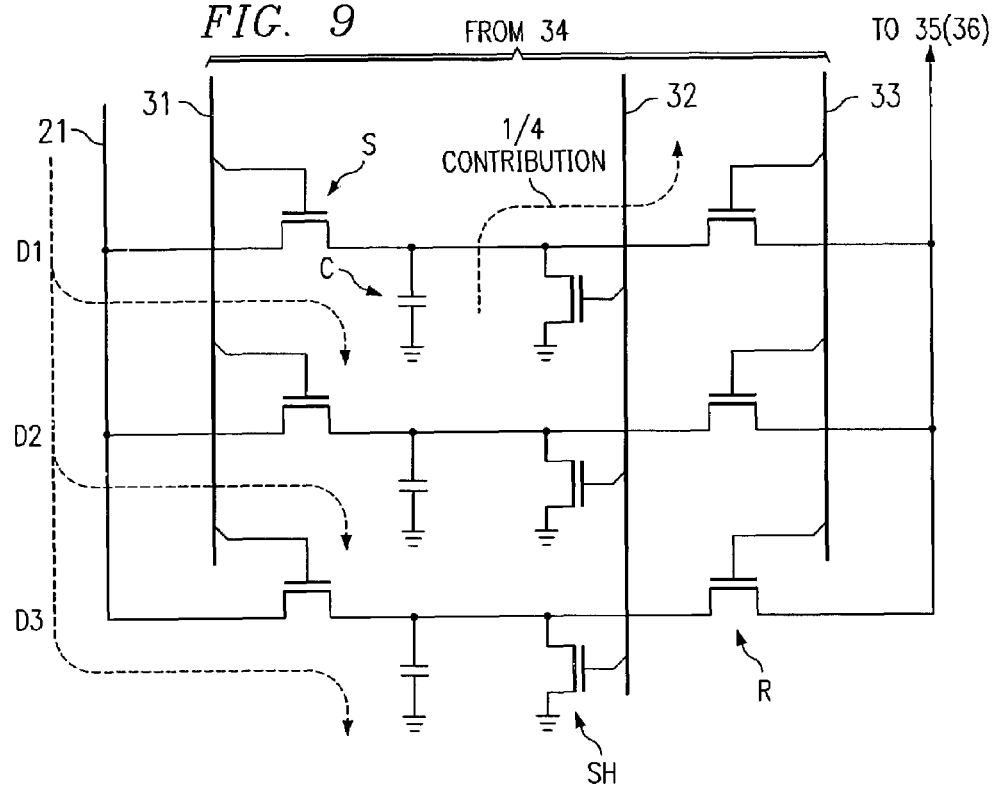
FIG. 9, taken in conjunction with FIG. 3, diagrammatically illustrates exemplary dummy sampler embodiments according to the invention.

FIG. 9 diagrammatically illustrates exemplary dummy stage embodiments which can be alternatively used to generate various fractional coefficients. There are three dummy stages D1, D2 and D3, in the example of FIG. 9. Each dummy stage includes a sampling switch S, a capacitor C, a shorting switch SH, and a read switch R. The sampling switches, shorting switches and read switches are respectively controlled by the DCU busses 31, 32 and 33. By closing the sampling switches S in all of the dummy stages D1-D3, while the sampling switch of one of the stages 1-8 of FIG. 3 is also closed, the sampled current is divided four ways, thereby permitting realization of a coefficient of 1, ¾, ½, or ¼, depending on how many of the capacitors in dummy stages D1-D3 are read when the associated capacitor of stages 1-8 is read. The shorting switches SH of the dummy stages D1-D3 can be activated after the dummy capacitors are read, thereby ensuring that all dummy capacitors (whether read or not) are discharged before the next use of the dummy stages. Note that two sets of the dummy stages shown in FIG. 9 can be provided, one for cooperation with the stages 1-4 of FIG. 3 and the other for cooperation with the stages 5-8 of FIG. 3.

Figure 10:
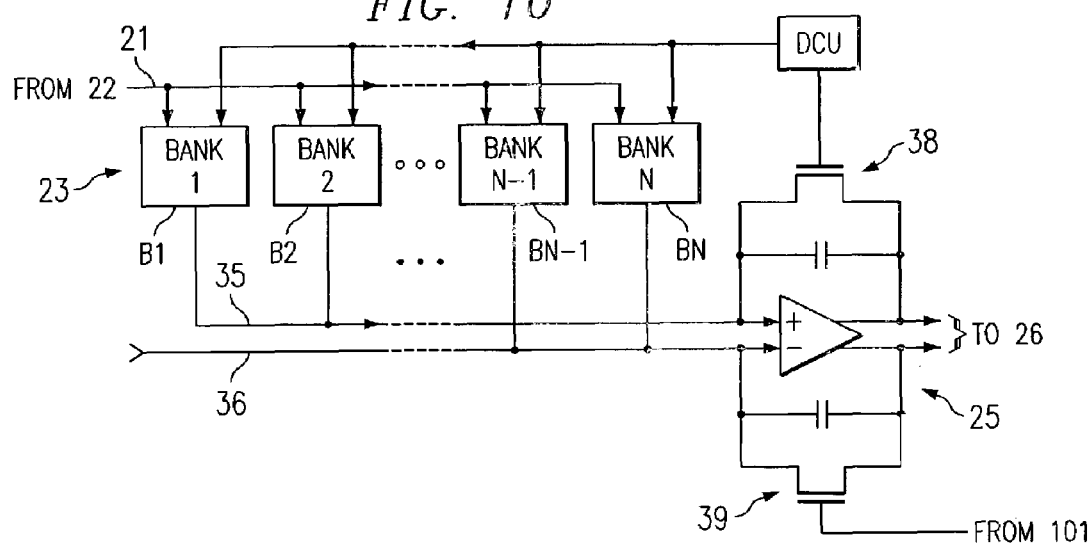
FIG. 10 diagrammatically illustrates exemplary embodiments of the invention wherein each capacitor of FIG. 3 is replaced by a bank of capacitors.

FIG. 10 diagrammatically illustrates pertinent portions of further exemplary embodiments of a subsampling communication receiver according to the invention. The arrangement of FIG. 10 is similar to the arrangement of FIG. 3, except each of the stages of FIG. 3 is replaced by a plurality of such stages. For example, for N=8 in FIG. 10, banks B1, B2, . . . BN−1, BN indicate that each of the 8 stages of FIG. 3 is replaced by a corresponding bank, wherein each bank includes a plurality of stages. Each of the banks receives the current waveform at 21 from the LNTA 22, just as each stage of FIG. 3 does, and each of the banks also receives control bus inputs from a DCU. Each bank also drives the IF amplifier 25, as does each stage of FIG. 3.

Figure 11:
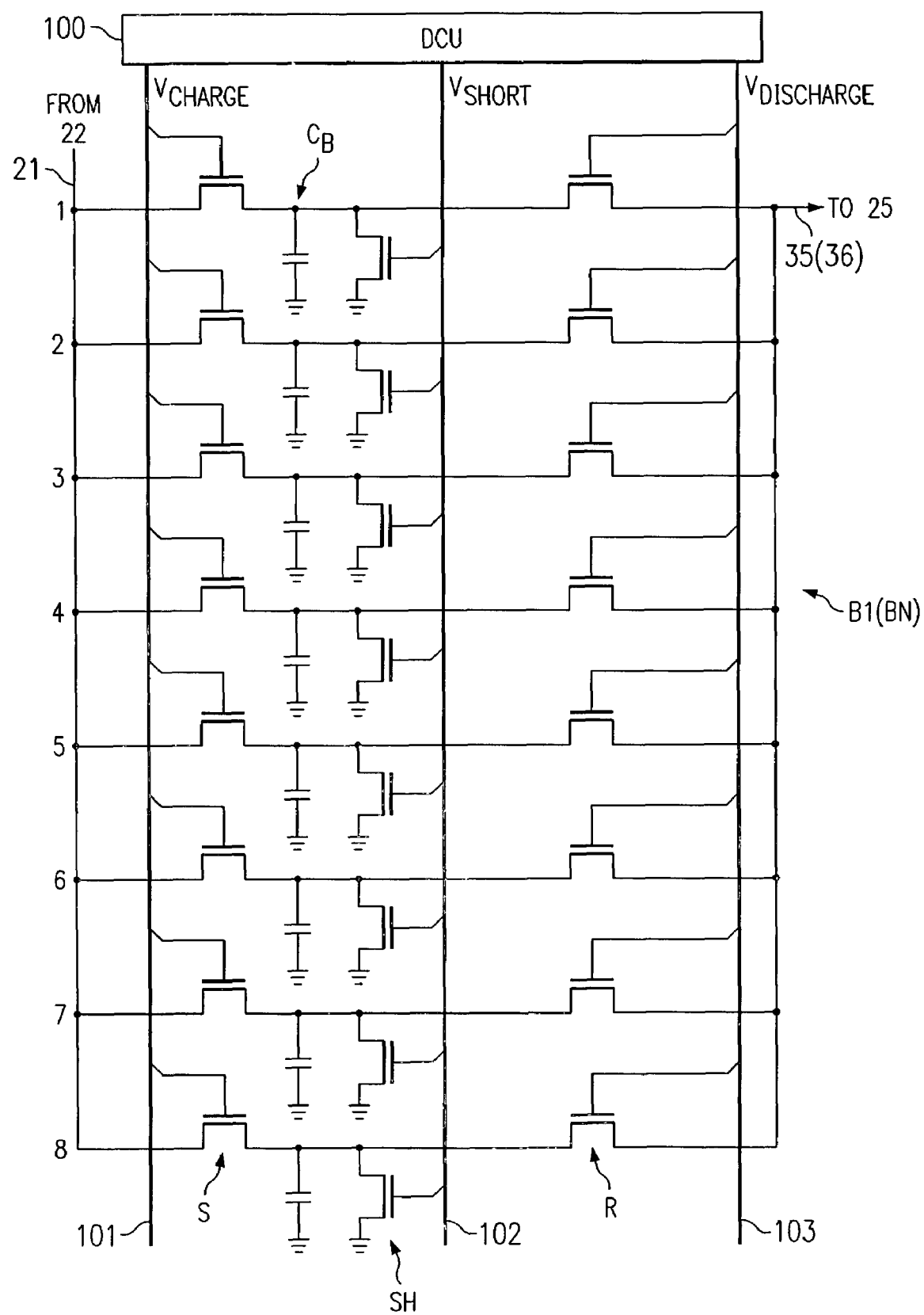
FIG. 11 diagrammatically illustrates exemplary embodiments of the capacitor banks of FIG. 10.

FIG. 11 diagrammatically illustrates exemplary embodiments of a bank of stages from FIG. 10. The example of FIG. 11 could correspond to any of the banks in FIG. 10. The exemplary bank of FIG. 11 includes 8 stages generally similar to the 8 stages of FIG. 3, each stage including a capacitor C, a sampling switch S, a shorting switch SH, and a read switch R. The sampling switches S are controlled by a DCU bus 101, the shorting switches SH are controlled by a DCU bus 102, and the read switches R are controlled by a DCU bus 103. Each stage of the bank of FIG. 11 includes a capacitor $C_B$. The value of the capacitor $C_B$ is determined from the total integrating capacitance value that is selected for the bank. For example, if an integrating capacitance value of K is desired, then the capacitance of $C_B$ would be K/(number of stages in the bank), for example K/8 in FIG. 11. In this manner, if all of the sampling switches S are closed by DCU 100 during a desired sampling interval, then the desired integrating capacitance K is presented to the current waveform at 21. However, by selectively activating the read switches R, coefficient values of 1, N−1/N, . . . 2/N and 1/N can be realized. That is, in the example of FIG. 11, coefficients of 1, ⅞, ¾, ⅝, ½, ⅜, ¼, and ⅛ can be realized. After the desired coeffficient has been read out to the IF amplifier, all remaining charges in the capacitors of the bank can be removed by activation of the shorting switches SH. The example of FIG. 11 can represent any of the banks B1, B2, etc. connected to the non-inverting input 35 of the IF amplifier 25 of FIG. 10, and can also represent any of the banks BN, BN–1, etc. connected to the inverting input 36 of the IF amplifier 25 of FIG. 10. In some embodiments, different banks of FIG. 10 may have different numbers of stages. This advantageously permits various levels of coefficient resolution.

Figures 12, 13:
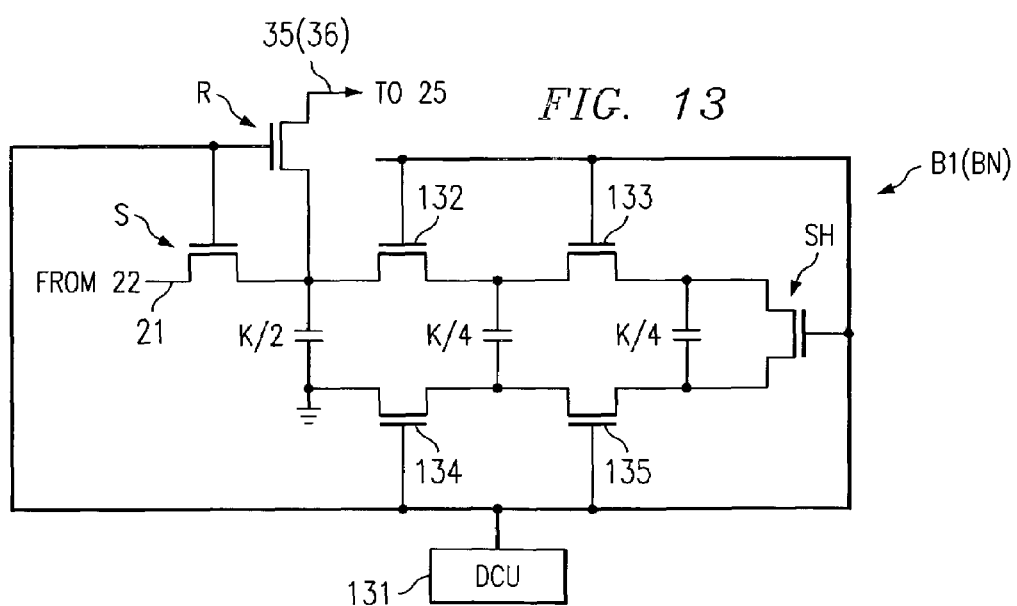
FIG. 12 illustrates in tabular format an example of how the digital control unit of FIG. 11 can control the switches of FIG. 11 to implement a desired FIR filter function.
FIG. 13 diagrammatically illustrates further exemplary embodiments of the banks of FIG. 10.

FIG. 12 illustrates in tabular format exemplary operations which can be performed by the DCU of FIG. 10, in conjunction with 8 bank structures B1-B8 such as shown in FIG. 11, to realize the following FIR filter function:

$$¼[x(n)]+⅛[x(n-1)].$$

The leftmost column of FIG. 12 indicates which sample operation is being performed, in generally the same manner as in FIGS. 5, 6 and 8 above, and the remaining four columns indicate which of 8 exemplary banks (B1-B8) has switches S1-S8 closed, which has switches R1 and R2 closed, which has switch R3 closed, and which has switches SH1-SH8 closed. For each bank, the desired capacitance is used for integration by closing all eight sampling switches S1-S8 during the sampling operation, the coefficient ¼ is produced by thereafter closing read switches R1 and R2, and the coefficient ⅛ is produced by thereafter closing read switch R3. Using bank B1 as an example, after the read switch R3 has been closed to produce the coefficient ⅛ (during sample SA3), bank B1's shorting switches SH1-SH8 are closed (during SA4) to remove all charges from the capacitors of bank B1. Note, for example, that during sample SA3, the capacitors of bank B2 are integrating during sample SA3, while read switches R1 and R2 of bank B5 are closed to produce the coefficient ¼ for sample SA2, and read switch R3 of bank B1 is closed to produce the coefficient ⅛ for sample SA1.

FIG. 13 diagrammatically illustrates further exemplary embodiments of the banks of FIG. 10. The bank of FIG. 13 includes three capacitors, two of which have a capacitance value equal to K/4, where K is the desired integrating capacitance, and one of which has a capacitance value of K/2. The DCU 131 of FIG. 13 appropriately controls the sampling switch S, shorting switch SH and the further transistor switches 132-135 such that the current waveform 21 sees the desired capacitance K (by closing switches 132-135 with switch SH open). For read out, the DCU 131 controls the read switch R and the switches 132-135 as desired to produce a coefficient value of 1 (switches 132-135 all closed), a coefficient value of 0.75 (switches 132 and 134 closed, switches 133 and 135 open), or a coefficient value of 0.5 (switches 132-135 all open). After a desired coefficient has been realized using the bank of FIG. 13, any unwanted charge can be removed by closing switches 132-135 along with shorting switch SH.

FIGS. 15A-15B illustrate in tabular format exemplary operations which can be performed by stages 1-4 of FIG. 3 in response to DCU 34. As shown in FIGS. 15A-15B, beginning at sample SA19, read switch R1 is closed in order to read out the integrated samples stored in the capacitor of stage 1. This read operation of switch R1 continues through sample SA35 and, beginning with sample SA37, the samples integrated and stored by stage 2 are read out by closure of read switch R2. The samples integrated and stored by stages 3 and 4 are thereafter consecutively read out, after which the readout process returns to stage 1 and progresses through stages 1-4 repeatedly. Thus, in the example of FIGS. 15A-15B, after sample SA17, the integrated samples stored in stages 1-4 are continuously being read out to the IF amplifier 25 (see also FIG. 3). It should be clear that stages 5-8 can be operated analogously (not shown in FIGS. 15A-15B) with respect to the even numbered samples SA2, SA4, etc. Under these conditions, there is no opportunity to reset the IF amplifier 25 of FIG. 3, for example, by operating switches 38 and 39 appropriately to short their associated capacitors. There is likewise no opportunity to make conventional offset corrections, internal resets, or other conventional adjustments in the IF amplifier. The situation of FIG. 15 can arise, for example, because the IF amplifier is operating at its maximum data rate just to "keep up" with the incoming samples.

FIG. 16 diagrammatically illustrates further exemplary embodiments of the invention which permit resetting or otherwise correcting or adjusting the IF amplifier. FIG. 16 illustrates additional stages such as shown in FIG. 3, which can be added to the arrangement of FIG. 3. Stage 9 as illustrated in FIG. 16 includes a sampling switch S, capacitor C, shorting switch SH and read switch R, just as do the other stages of FIG. 3. Stage 9, as illustrated, is intended to be cooperable with stages 1-4, and stage 10, as illustrated parenthetically in FIG. 16, is intended to be cooperable with stages 5-8. The cooperation of stage 9 with stages 1-4 permits any desired adjustment of the IF amplifier 25. One example of such cooperation between stages 1-4 of FIG. 3 and stage 9 of FIG. 16 is illustrated in FIGS. 17A-17B.

From sample SA1 through sample SA71 in FIG. 17A, the sampling switch operation of FIG. 17A is identical to that of FIG. 15A. However, FIG. 17A differs from FIG. 15A beginning at sample SA55, because switch R3 is not closed during samples SA55 through SA71, in contrast to FIG. 15A. Thus, stage 3 is not read out to the IF amplifier during this period of time, thereby permitting adjustment of (or settling time for) the IF amplifier. Stages 5-8 can be operated analogously relative to even numbered samples in generally the same time period to permit adjustment of IF amplifier 25. The invention thus creates a period of time during which the IF amplifier can be adjusted and reset as needed. Beginning with sample SA73 and continuing through sample SA121, the sampling switch S9 of stage 9 replaces the sampling switch S3 of stage 3 in the sampling operation. Because the sampling switch S3 of stage 3 is not closed during this period of time, both read switches R3 and R4 of stages 3 and 4 can be closed from SA73 through SA89, instead of only read switch R4 as in FIG. 15A. Beginning with sample SA91 and continuing through sample SA125, the read switch operation of FIG. 17B is the same as the read switch operation of FIG. 15B. From sample SA127 through sample SA167, the sampling switch operation of FIG. 17B is the same as shown as in FIG. 15B. However, beginning with sample SA127 and continuing through sample SA143, no read switch is closed, thereby permitting the IF amplifier to be adjusted. Beginning at sample SA145 and continuing through sample SA161, both read switch R4 and read switch R9 are closed, instead of only read switch R4 as in FIG. 15B. Thereafter, beginning at sample SA163, read switch R1 is closed, as in FIG. 15B. Beginning at sample SA163, the read switch operation pattern illustrated at SA19 through SA161 repeats itself, and sample switch S9 is again substituted for sample switch S3 in generally the same manner described above. Stages 5-8 can be operated analogously in conjunction with stage 10 to process the even numbered samples.

Thus, by adding stage 9 for cooperation with stages 1-4 and stage 10 for cooperation with stages 5-8, additional samples can be integrated and stored while no read switch is closed, thereby permitting the IF amplifier to be adjusted.

FIG. 18 illustrates exemplary operations which can be performed by the embodiment of FIG. 3 to permit resetting of the IF amplifier. In the example of FIG. 18, stage 1 integrates and stores the first 9 odd numbered (i.e. positive half cycle) samples, stage 2 integrates and stores the next 9 samples, stage 3 integrates and stores the next 9 samples, and stage 4 integrates and stores the next 9 samples. This pattern of each stage integrating and storing 9 successive positive half cycle samples is repeated throughout the example of FIG. 18. However, in this example, no read switches are closed while sampling switch S4 is closed. After all 4 stages have integrated and stored samples, namely beginning with sample SA73, read switches R2, R3 and R4 are closed along with sampling switch S1, read switches R1, R3 and R4 are closed along with sampling switch S2, and read switches R1, R2 and R4 and closed along with sampling switch S3. Thus, the operation illustrated at sample SA73 through SA143 repeats itself beginning at sample SA145. Stages 5-8 of FIG. 3 can be operated analogously with respect to the even numbered (negative half cycle) samples. Because no read switches are closed along with sampling switch S4 (and analogously S8), the IF amplifier can be adjusted while stages 4 and 8 are sampling and integrating their allocated number of samples (9 each in this example).

Figure 19:
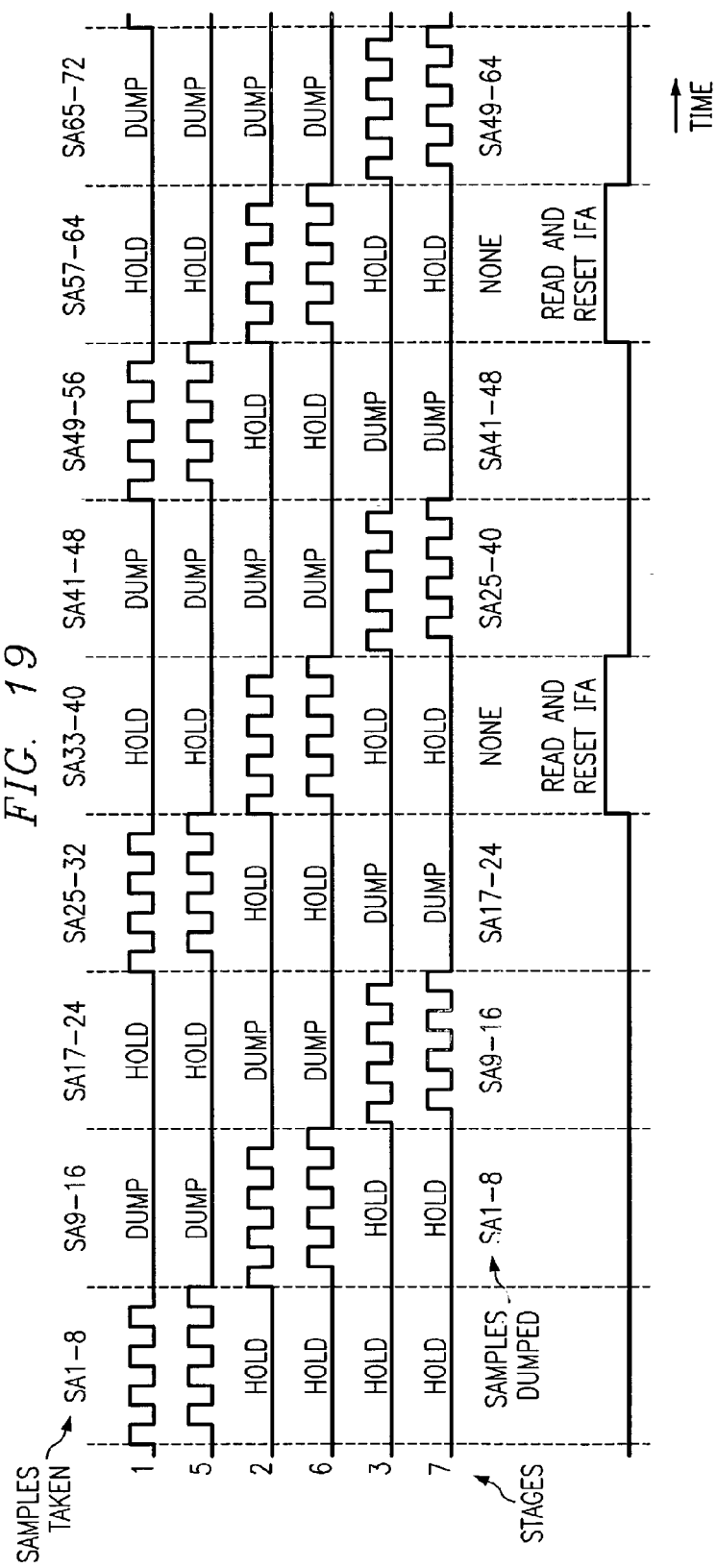
FIG. 19 is a timing diagram which illustrates exemplary operations which can be performed by the embodiments of FIG. 3.

FIG. 19 is a timing diagram which illustrates exemplary operations which can be performed by stages 1-3 and 5-7 of the arrangement of FIG. 3 (or FIG. 3A). The square wave pulses illustrated in FIG. 19 are the digital control pulses applied by the DCU to the gates of the sampling switches S of the stages illustrated in FIG. 19. Thus, for example, stages 1 and 5 are used to integrate samples SA1-SA8, stages 2 and 6 are used to integrate samples SA9-SA16, and stages 3 and 7 are used to integrate samples SA17-SA24. Stages 1 and 5 are then used again to integrate samples SA25-SA32, and so on as illustrated.

Also in FIG. 19, the term "hold" designates those periods of time wherein both the sampling switch S and the read switch R of a given stage are both open. Also, the term "dump" in FIG. 19 designates those periods of time wherein the sampling switch S of a given stage is open while the read switch R of that stage is closed, thereby permitting the charge stored in the capacitor C of that stage to be "dumped" to the IF amplifier 25. Thus, as shown in FIG. 19, samples SA1-SA8 are integrated by stages 1 and 5, samples SA9-SA16 are integrated by stages 2 and 6, samples SA1-SA16 are dumped from stages 1, 2, 5 and 6 while samples SA17-SA24 are integrated by stages 3 and 7, and samples SA17-SA24 are dumped from stages 3 and 7 while samples SA25-SA32 are integrated by stages 1 and 5.

Thereafter, while stages 2 and 6 integrate samples SA33-SA40, all of stages 1, 3, 5 and 7 are held instead of dumped. Then, while stages 3 and 7 integrate samples SA41-SA48, samples SA25-SA32 (previously integrated by stages 1 and 5) are dumped by stages 1 and 5, and samples SA33-SA40 (previously integrated by stages 2 and 6) are dumped from stages 2 and 6. During the integration of samples SA33-SA40 by stages 2 and 6, and while samples SA25-SA32 are still being held in stages 1 and 5, the IF amplifier 25 can be adjusted, as illustrated in FIG. 19. Thereafter, while stages 3 and 7 integrate samples SA41-SA48, stages 1 and 5 "catch up" by dumping samples SA25-SA32 simultaneously with the dumping of samples SA33-SA40 from stages 2 and 6. Thereafter, samples SA49-SA56 are integrated by stages 1 and 5 while stages 3 and 7 dump samples SA41-SA48, after which samples SA49-SA56 are held in stages 1 and 5 while stages 2 and 6 integrate samples SA57-SA64. This permits the IF amplifier to be adjusted while stages 2 and 6 integrate samples SA57-SA64. Stages 1 and 5 "catch up" while stages 3 and 7 integrate samples SA65-SA72. This "catch up" is again accomplished by dumping stages 1 and 5 (samples SA49-SA56) simultaneously with stages 2 and 6 (samples SA57-SA64).

FIG. 19A illustrates in tabular format a simplified example of operations which can be performed by the embodiments of FIG. 3 (or FIG. 3A). The example of FIG. 19A assumes that stages 1 and 2 of FIG. 3 are used to capture all positive half cycle samples, and that stages 5 and 6 of FIG. 3 are used to capture all negative half cycle samples (not explicitly shown in the example of FIG. 19A). In FIG. 19A, stages 1 and 2 each capture sets of four consecutive positive half cycle samples in alternating fashion, and the samples captured by each stage are read out to the IF amplifier during the sampling operation of the other stage. Stages 5 and 6 cooperate similarly to capture and read out the negative half cycle samples. In the example of FIG. 19A, the maximum data rate of the IF amplifier is such that the read out periods in FIG. 19A are the same length as the sampling periods. Thus, a situation analogous to that described above with respect to FIGS. 15A and 15B arises, namely, the IF amplifier is completely occupied in "keeping up" with the captured samples, so there is no time available to adjust the IF amplifier.

FIG. 19B illustrates in tabular format one exemplary solution to the problem of FIG. 19A according to the invention. In the simplified example of FIG. 19B, stage 3 of FIG. 3 (or FIG. 3A) is used to provide time for adjusting the IF amplifier. After stage 1 has collected four consecutive positive half cycle samples, stage 2 then collects the next four consecutive positive half cycle samples. Thereafter, the next four positive half cycle samples are collected by stage 3, while stages 1 and 2 are read out to the IF amplifier. The next four samples are collected by stage 1, after which stage 2 collects the next four samples, while stages 1 and 3 are read out to the IF amplifier. The next four samples are collected by stage 3, after which stage 1 collects the next four samples while stages 2 and 3 are read out to the IF amplifier. The next four samples are collected by stage 2, after which stage 3 collects the next four samples, while stages 1 and 2 are read out to the IF amplifier. When compared to the operation of FIG. 19A, the use of the third stage (stage 3) in FIG. 19B permits the last eight samples collected to be read out to the IF amplifier during the time period needed to collect the next four samples. This permits the IF amplifier to "keep up" with the sample collection rate, but the read out operation occurs only half as often as in FIG. 19A, thus providing idle time periods where no samples are being read out to the IF amplifier, and the IF amplifier can be suitably adjusted during those idle time periods. Regarding the negative half cycles, it should be clear that stage 7 can be used in conjunction with stages 5 and 6 (see also FIG. 3) to achieve the same results that are achieved by using stage 3 in conjunction with stages 1 and 2 as shown in FIG. 19B.

FIG. 19C illustrates in tabular format another exemplary solution to the problem of FIG. 19A according to the invention. In the simplified example of FIG. 19C, stages 1 and 2 each collect sets of eight consecutive positive half cycle samples in alternating fashion. After stage 1 has collected eight consecutive positive half cycle samples, the samples collected by stage 1 are read out while stage 2 is collecting the first four of its eight positive half cycle samples. After stage 2 has completed collection of its eight samples, then those eight samples are read out while stage 1 is collecting the first four of its next eight samples. Thus, as in FIG. 19B, the IF amplifier read out cycles are spaced apart by idle periods of time wherein the IF amplifier can be adjusted as desired. FIG. 19C also indicates parenthetically that the sampling capacitor of stage 1 can be reset (by closing switch SH1) while stage S2 is collecting the last four of its eight samples, because all samples previously collected by stage 1 were read out to the IF amplifier while stage 2 was collecting its first four samples. Similarly, the sampling capacitor of stage 2 can be reset while stage 1 is collecting the last four of its eight samples, because the samples previously collected by stage 2 were read out to the IF amplifier while stage 1 was collecting the first four of its eight samples. The operations illustrated in FIG. 19C can of course be applied to the negative half cycles by analogously operating stages 5 and 6 of FIG. 3.

It can be seen from a comparison of FIGS. 19B and 19C that, in both examples, eight previously collected positive half cycle samples are read out to the IF amplifier while the next four positive half cycle samples are being collected. Thus, the examples of FIGS. 19B and 19C are identical with respect to their filtering characteristics. However, in the example of FIG. 19B, the eight samples that are read out to the IF amplifier are collected on two different stages, with four samples on each stage, whereas in FIG. 19C, all eight samples that are read out to the IF amplifier are collected on a single stage. The accumulation of eight samples on a single capacitor in FIG. 19C provides more voltage gain than does the accumulation of four samples on two different capacitors in FIG. 19B. Thus, although the examples of FIGS. 19B and 19C exhibit identical filtering characteristics, these two examples differ in their respective gain characteristics, with FIG. 19C providing better gain performance. The differing gain characteristics between the examples of FIGS. 19B and 19C can be used as part of the automatic gain control loop of the receiver of FIG. 3 (or FIG. 3A). (The gain can be changed, for example, by making the capacitors of the different stages proportionately smaller.) Given that the example of FIG. 3 (or FIG. 3A) includes eight stages, the operations of FIGS. 19B or 19C can be readily accommodated by the embodiments of FIG. 3 (or FIG. 3A), thereby permitting the gain to be controlled, for example, by switching between operations such as illustrated in the examples of FIGS. 19B and 19C according to whether the gain is to be increased (FIG. 19C) or decreased (FIG. 19B).

Referring again to the example of FIG. 19, the IFA read out (dump) period is twice as long as the IFA reset period. In the examples of FIGS. 19B and 19C, the read out and adjustment periods are equal in length. FIG. 19D illustrates another example wherein the IFA adjustment period is twice as long as the IFA read out period. In the example of FIG. 19D, stage 1 collects eight consecutive samples, after which stages 1 and 3 are read out while stage 2 collects the next four samples. Thereafter, stage 1 collects the next eight samples, after which stages 1 and 2 are read out while stage 3 collects the next four samples. This process then repeats itself as shown. In the example of FIG. 19D, twelve previously collected positive half cycle samples are read out to the IF amplifier while the next four positive half cycle samples are being collected. Thus, the filtering characteristics of the example of FIG. 19D differ from the filtering characteristics of FIGS. 19B and 19C. The operations illustrated in FIG. 19D can be performed using, for example, the arrangement of FIG. 3 or FIG. 3A. Of course, the negative half cycle samples can be handled analogously to the handling of positive half-cycle samples illustrated in FIG. 19D.

As mentioned above, FIGS. 19B and 19D illustrate simplified examples of operations according to the invention. The concepts illustrated in FIGS. 19B-19D can of course be extended to implement any desired IF read out timing arrangement, for example, by adding more sampling stages as necessary.

It should be clear from the foregoing discussion that the IF amplifier can provide filtering as well as gain. The filtering may be performed in an active manner, a passive manner (e.g. using capacitors $C_A$ of FIG. 3A), or a combination of active and passive filtering. Idle time periods can be provided to permit internal offset correction or other adjustments with respect to IF amplifier. These idle time periods can be provided periodically after each read out period. The length of the idle time periods can be the same as, greater than or less than the length of the read out time periods.

As illustrated by the exemplary embodiments of FIGS. 15-19D, various numbers of stages can be utilized and controlled appropriately to realize any desired ratio of adjustment (idle) period length to read out period length.

Referring again to FIG. 7, the signal y(n) can be expressed as follows:

$$y(n) = \sum_{i=0}^{M-1} cf(i) \cdot x(n-i).$$

In the frequency domain, this becomes:

$Y(z)=C(z)X(z).$

Note that C(z) can be also be expressed as follows:

$C(z)=C(z)[(1-z^{-1})/(1-z^{-1})]=C^{diff}(z)/(1-z^{-1})$, where $C^{diff}(z)=C(z)-z^{-1}C(z).$ $C^{diff}$ can be considered to be a filter whose output is given by:

$Y^{diff}(z)=C^{diff}(z)X(z).$

Note that, in $C^{diff}$, the term $z^{-1}C(z)$ is merely a delayed response of the filter C(z), so $C^{diff}$ is realized by using a filter whose coefficients are obtained by subtracting cf(i−1) from cf(i). Such coefficients are conventionally referred to as differential coefficients, and the use of filters with such differential coefficients is well known in the art. For a filter having coefficients that are highly correlated, the dynamic range requirement of the filter can be reduced by using the $C^{diff}$ filter with the differential coefficients. The digital time domain function $y^{diff}(n)$ corresponding to $Y^{diff}(z)$ is expressed as follows:

$$y^{diff}(n) = cf(0)x(n) + \sum_{i=1}^{M-1}(cf(i)-cf(i-1))x(n-i) - cf(M-1)x(n-M+1).$$

The dynamic range requirement of a filter utilizing differential coefficients is typically only a small fraction of the dynamic range requirement of the original filter.

Figure 20:
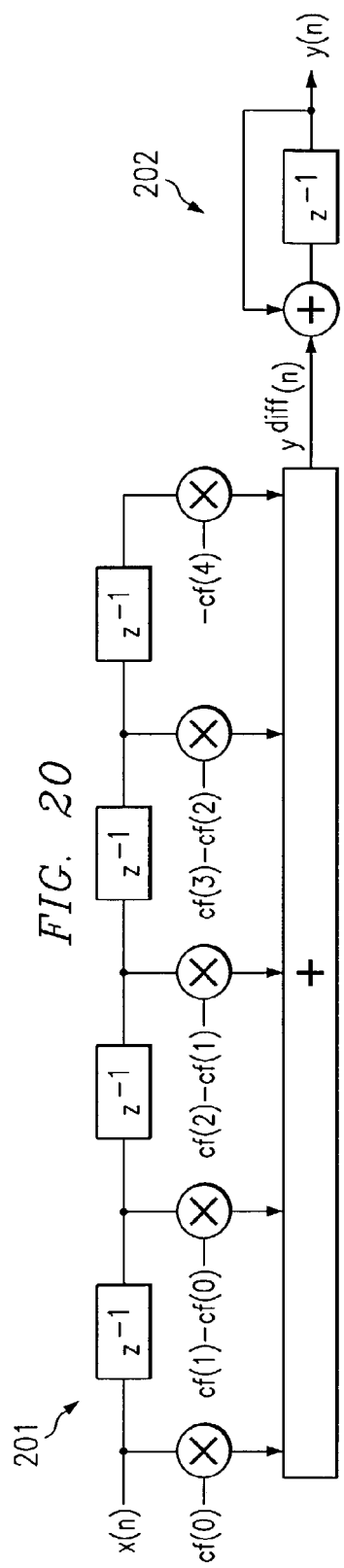
FIG. 20 diagrammatically illustrates a differential filter which can be implemented by the embodiments of FIGS. 2-13.

FIG. 20 diagrammatically illustrates an exemplary embodiment of a differential filter which can be realized by the embodiments of FIGS. 2-13. The structure of the differential filter 201 of FIG. 20 is generally similar to that of the filter illustrated in FIG. 7 (for M=4), except the DCU controls the sampling switches S and read switches R such that the filter utilizes the illustrated differential coefficient values. The differential filter 201 produces the signal $y^{diff}(n)$, which is then applied, in the embodiment of FIG. 20, to an integrating filter 202 which produces the desired signal y(n). The integrating filter 202 accounts for the fact that $C^{diff}(z)$ must be divided by $(1-z^{-1})$ to obtain the desired transfer function C(z). In some exemplary embodiments, the integrating filter illustrated at 202 can be replaced by another recursive filter. In other exemplary embodiments, the filter at 202 can be completely eliminated, and unwanted interferer energy will still be substantially rejected.

Figure 21:
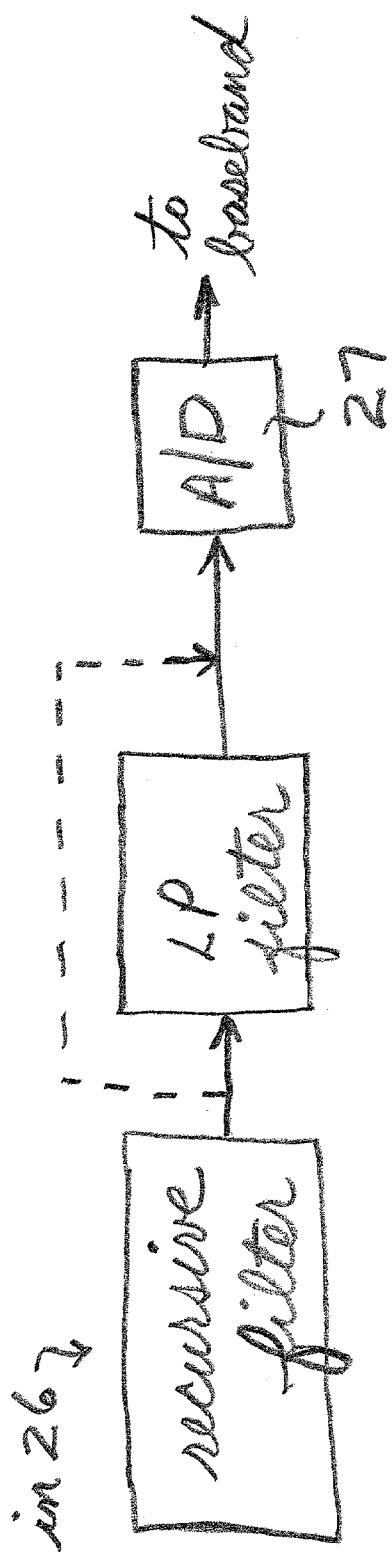
FIGS. 21 and 22 illustrate exemplary positioning of a recursive FIR filter for cooperation with the differential filter of FIG. 20.
Figure 22:
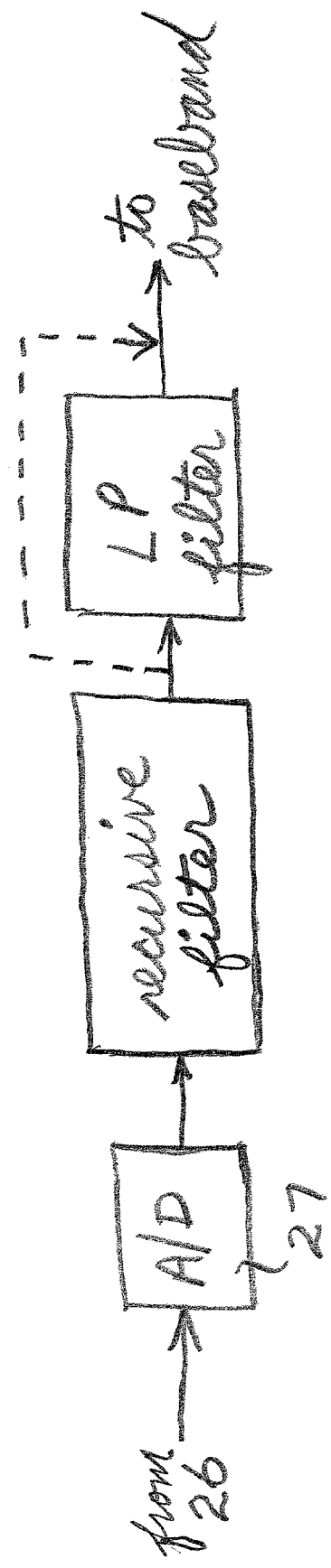

FIGS. 21 and 22 diagrammatically illustrate exemplary positioning of a recursive filter (for example the integrator of FIG. 20 or a lossy integrator) according to the invention. As shown in FIG. 21, the recursive filter can be implemented within the analog signal processing section 26 of FIG. 2 and, as shown in FIG. 22, the recursive filter can be implemented digitally at the digital output side of the A/D converter 27 of FIG. 2. FIGS. 21 and 22 also illustrate further exemplary embodiments wherein the output of the recursive filter can be applied to a low pass (LP) filter to obtain additional filtering functions. In other embodiments, the low pass filter can be omitted, as shown by a broken line in FIGS. 21 and 22.

The dynamic range of differential coefficients is reduced when using the sliding window integration technique described above relative to FIG. 8A. This means that a smaller capacitor spread can be used to realize a filter that would otherwise require a much larger capacitor spread. For example, the original filter may require realizing a capacitor spread of 1 pF-256 pF, which is very difficult due to large dynamic range. For a narrowband filter, using differential coefficients can advantageously reduce this dynamic range to a much smaller range of variation.

FIG. 23 diagrammatically illustrates exemplary embodiments of portions of the multi-tap digital subsampling receiver architecture of FIG. 2. FIG. 23 presents a single-ended example including stages 1-8 as shown in FIG. 3, but wherein the outputs of all read switches R are connected together at the inverting input of the IF amplifier, whose non-inverting input is connected to a fixed potential (e.g. ground) to provide the single-ended configuration.

If, for example, stages 1 and 2 are operated to integrate alternate samples in a sequence of J samples, such as shown in the first two rows of the table in FIG. 24 (see also FIG. 4), and if the charges stored in stages 1 and 2 are thereafter read out to the IF amplifier 25, as shown (by closure of read switches R1 and R2) in the third and fourth rows of the table of FIG. 24, then the equivalent filter is illustrated in FIG. 25. That is, J consecutive samples, namely SA1-SAJ, are integrated and stored in stages 1 and 2, in response to control signals produced by the DCU on the sampling switch control bus 31. This operation of the sampling switch control bus 31 results in the computation of an inner product with the sequence $\{1, 1 \ldots 1\}$. Thus, any sampling switch control sequence applied, for example, to sampling switches S1 and S2 is correlated with the input signal, and the result is stored in the corresponding capacitors of stages 1 and 2. Therefore, despreading of CDMA signals can be obtained by applying the spreading sequence or pseudo-noise (PN) code at sampling switches S1 and S2. The capacitors of stages 1 and 2 then act as a correlator. The output of the correlator can then be moved to the IF amplifier 25. The DCU can provide the spreading sequence or the PN code at the control inputs of the sampling switches S1 and S2.

As shown in FIG. 24, after samples SA1-SAJ have been integrated by stages 1 and 2, samples SAJ+1-SA2J are sampled and integrated by stages 3 and 4 while the integrated samples from stages 1 and 2 are read out to the IF amplifier. Thereafter, the samples SA2J+1-SA3J are integrated and stored by stages 1 and 2, while samples SAJ+1-SA2J stored in stages 3 and 4 are read out to the IF amplifier. Samples SA3J+1-SA4J (not explicitly shown) are handled by stages 3 and 4, as stages 1 and 2 continue to alternate with stages 3 and 4, stages 1 and 2 integrating while stages 3 and 4 are reading out, and vice versa.

If the LNTA 22 is designed to provide two independent (e.g. current mirrored) outputs (not explicitly shown in FIG. 23), with one output connected to stages 1-4 and the other output connected to stages 5-8, then the structure of FIG. 23 can parallelize the despreading operation, because a different spreading sequence or PN code can be used with respect to stages 5-8 than is used with respect to stages 1-4. This can be viewed as a RAKE operation with stages 1-4 used as a first RAKE finger and stages 5-8 used as a second RAKE finger. The capacitors C associated with each RAKE finger contain the correlator output values. Thus, stages 5, 6, 7 and 8 process the same samples as stages 1, 2, 3 and 4, respectively, but with a different spreading sequence or PN code.

Continuing with the example of FIGS. 23-25, any additional number of RAKE fingers can be provided by simply adding 4 additional stages for each additional RAKE finger. Moreover, additional stages can also be added for the purpose of relaxing the readout and reset timing of the IF amplifier 25, in generally the same fashion as described above with respect to FIGS. 15-19.

In general, let $r_i(t)$ be the received signal for the ith coded element, let $c_i(t)$ be the ith code symbol and let $p_i(t)$ be the information-carrying signal waveform of duration $T_C$. The "C" in the subscript portion of $T_c$ represents the fact that the variable refers to a "chip." The ith received bit is given as: $r_i(t)=p_i(t)\ c_i(t)+z(t)$ for $iT_c \leq t \leq (i+1)\ T_c$. The term z(t) noise sample generally assumed to be white and Guassian.

Figure 23A:
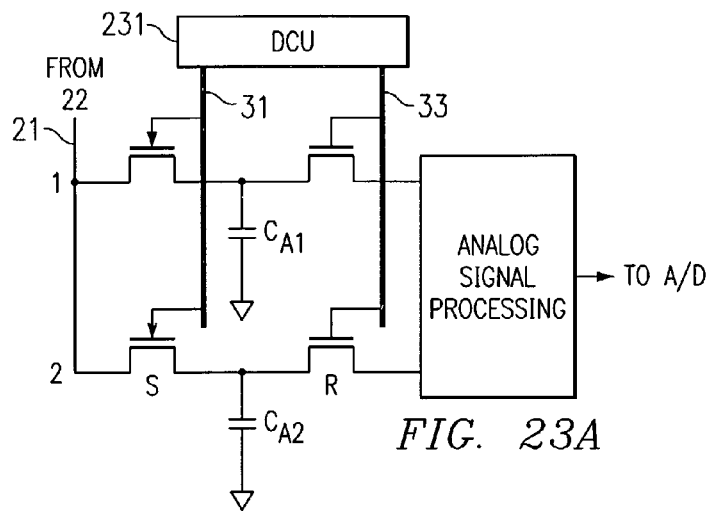

Referring now to FIG. 23A, and assuming that the incoming (e.g. RF) signal waveform (from which the current waveform 21 is produced by the LNTA 22) is encoded at the transmitter with some PN sequence, then the DCU 231 can control the sampling switches S1 and S2 in accordance with the transmitter's PN sequence, such that the current waveform at 21 is integrated on the sampling capacitors $C_{A1}$ and $C_{A2}$ according to the PN sequence.

Figure 23B:
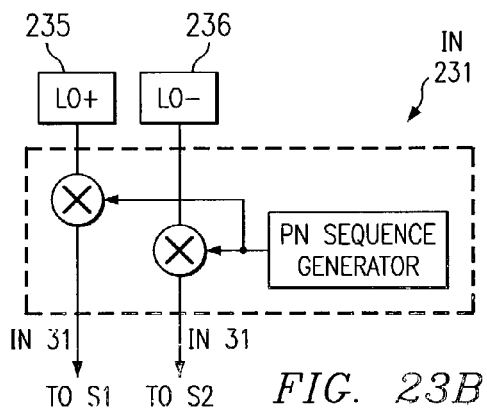

FIG. 23B diagrammatically illustrates pertinent portions of exemplary embodiments of the DCU 231 of FIG. 23A. In the example of FIG. 23B, the PN sequence generator, whose output corresponds to $c_i(t)$, determines how the signals LO+ and LO− will be used to control the sampling switches S1 and S2 (see also FIGS. 3 and 4). Assume, for example, that the PN sequence is phase locked to the zero crossing of the incoming waveform. Then, during the time when $c_i(t)=+1$, the sampling switches are controlled such that $C_{A1}$ integrates the area under the first half cycle and $C_{A2}$ integrates the area under the second half cycle. This pattern repeats itself such that all odd half cycles (e.g. all positive half cycles) are integrated on $C_{A1}$, while all even half cycles (e.g. all negative half cycles) are integrated on $C_{A2}$.

When $c_i(t)=-1$, the roles of the two sampling stages are interchanged, so that $C_{A1}$ integrates the area under the even (negative) half cycles, while $C_{A2}$ integrates the area under the odd (positive) half cycles.

As subsequent chips from the PN sequence are generated, the two capacitors of FIG. 23A accumulate the inner product which implements the cross-correlation of the PN sequence with the received signal waveform that has been encoded with the same PN sequence, thereby inverting the encoding operation of the transmitter where the baseband information was originally multiplied by the PN sequence.

This approach provides a general scheme in which the received voltage waveform is converted to a current waveform and integrated on a capacitor through a control signal. This integration operation is effective to compute an inner product of the received voltage waveform with the control signal. This inner product computation produces a cross-correlation of the received voltage waveform with the control signal and saves the result on the sampling capacitors.

According to other exemplary embodiments of the invention, each of stages 1 and 2 of FIG. 23A can be replaced by a bank of stages, of the same general type described above with respect to FIGS. 10-13. By using banks of sampling stages instead of individual sampling stages, a given sample can be distributed onto the various capacitors of the corresponding bank. Therefore, each sampling capacitor in a bank implements a sub-inner product computation in which a smaller cross-correlation is accumulated individually on that capacitor. The more stages in the bank, the smaller the cross-correlations. In some exemplary embodiments, all capacitors of a given bank can be read out together to form the final inner product.

In some exemplary embodiments, the read switches R of a given bank can be operated separately and independently such that the aforementioned smaller cross-correlation samples can be read out from the bank separately and independently. Such embodiments can be used to obtain independent cross-correlations which begin and end at different times. One application for such independent cross-correlations is, for example, the acquisition phase, wherein the receiver searches for the correct phase for the beginning of PN sequence.

Another exemplary application for multi-stage banks is the implementation of a diversity receiver. In such embodiments, sub-inner products computed on capacitors of different banks can be selectively combined to form samples which correspond to the independent fingers in a RAKE receiver. Because each capacitor in a given bank holds the same sub-inner product, groups of different sub-inner products can be combined together (for example, combining together the sub-inner products from respective capacitors in two or more banks) to obtain independent inner products which begin and end at different times. This combination of sub-inner products from different banks can be accomplished by the DCU suitably controlling the read switches in the various banks.

Figure 23D:
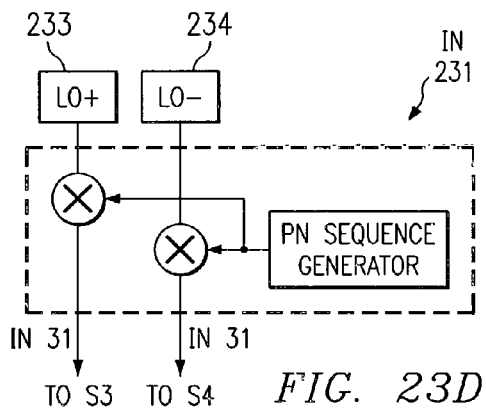
Figure 23C:
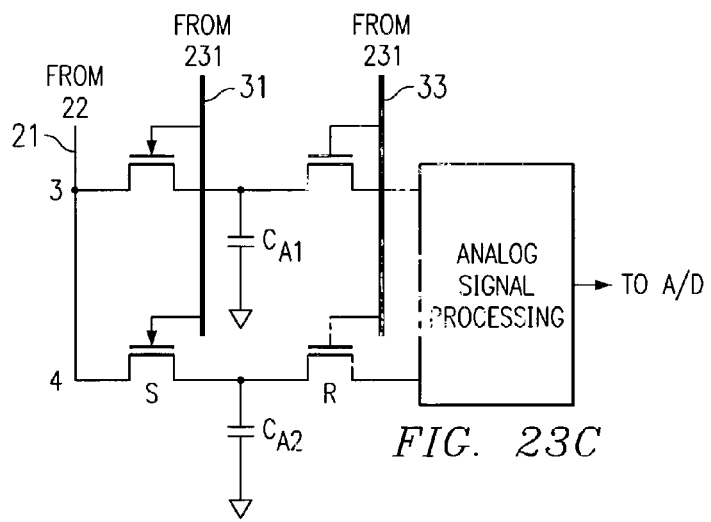

In some exemplary embodiments, a non-coherent receiver can be realized by duplicating the structure of FIG. 23A as shown in FIG. 23C. By combining stages 3 and 4 of FIG. 23C with stages 1 and 2 of FIG. 23A, both I and Q branches can be realized. For example, the structure of FIG. 23A can be the Q branch and the structure of FIG. 23C can be the I branch. As shown in FIG. 23D, such a non-coherent receiver embodiment can include in its DCU additional structure for controlling the switches S3 and S4 of "I" stages 3 and 4. The structure of FIG. 23D is similar to that of FIG. 23B, except the LO+ and LO− signals at 233 and 234 in FIG. 23D lag by 90° the respectively corresponding signals at 235 and 236 in FIG. 23B.

In other exemplary embodiments, the structures of FIGS. 23A and 23C can be driven by non-orthogonal local oscillators, and the correct combination of the samples can be performed in the baseband, either in the analog or digital domain. Other exemplary embodiments can utilize three or more structures of the type shown in FIG. 23A, with the two sampling switches of each individual structure being controlled by a local oscillator signal having a phase which has been pre-selected for that particular structure.

The analog signal processing block of FIGS. 23A and 23C can include, for example, the IF amplifier 25 and the analog signal processing section 26 described hereinabove. This analog signal processing block provides gain to the downconverted cross-correlated signal for subsequent analog-to-digital conversion. It should also be clear from the foregoing discussion that the analog signal processing block of FIGS. 23A and 23C may additionally serve to combine the outputs of the RAKE fingers to form the output of the diversity receiver.

The foregoing description of FIGS. 23A-23D assumes that $p_i(t)$ is a rectangular waveform. However, in some embodiments, $p_i(t)$ can have a pre-selected pulse shape which yields a waveform other than a rectangular waveform. In such embodiments, the accumulation of the inner product must be weighted by the complex conjugate, $p_i^*(t)$. In some embodiments, the above-described current steering techniques may be used to obtain the desired weighting. A given bank of stages can be operated either such that the LNTA 22 sees a constant load or in such a way that the LNTA 22 sees a variable load.

In other embodiments, the sub-inner products may be read out to the analog signal processing block, which in turn furnishes the sub-inner products to the analog-to-digital converter. In such embodiments, the matched filter may be implemented in the digital domain, such that the digital baseband processing section computes the final inner product by combining appropriately weighted sub-inner products. In such embodiments, the analog-to-digital converter must operate at a high enough rate to permit the sub-inner products to be read at a sufficiently high frequency for adequate matched filter realization. In these embodiments, the demodulation of the received signal is distributed between the analog domain and the digital domain such that most of the complex operations are performed in the digital domain.

The aforementioned ability to pass selected sub-inner products to the digital domain, by operating the analog-to-digital converter at a rate much higher than the information-carrying signal band, allows flexibility in that, for example, multiple copies of the sub-inner products can be made in the digital domain, thereby permitting acquisition of the initial phase for the PN sequence to be determined in the digital domain. Also, the sub-inner products associated with different RAKE fingers can be formed in the digital domain, thereby permitting these sub-inner products to be advantageously combined in the digital domain.

In other embodiments, the sub-inner product accumulation extends to more than one chip period before the sample is handed off to the A/D converter. In this scheme, the PN sequence generator in FIG. 23B (and 23D) may optionally be replaced by an analog pulse generator which generates $p_i^*(t)$ multiplied by the appropriate PN sub-sequence. As an example, suppose that the PN sequence is {+1, +1, −1, +1, −1, −1, −1, +1} and sub-inner product accumulations are desired for a time period of $2T_c$. Then the LO is mixed with $p_i^*(t)$, $p_i^*(t)$ and read-out; then mixed with $-p_i^*(t)$, $p_i^*(t)$ and read-out; then mixed with $-p_i^*(t)$, $-p_i^*(t)$ and read-out; and finally is mixed with $-p_i^*(t)$, $p_i^*(t)$ and read-out. The whole cycle is repeated. In this scheme, the LO is mixed with analog waveforms if p(t) is not rectangular. The pulse sequence mixed with the LO is used to control the sampling switches. A portion of an exemplary DCU embodiment for performing this sampling switch control operation is shown in FIG. 23E.

FIG. 14 illustrates exemplary operations which can be performed by exemplary embodiments of the present invention. At 141, the voltage waveform is transformed into a current waveform. At 142, capacitors are used to integrate samples of the current waveform. At 143, analog signal processing (for example to produce FIR filtering) is performed on the integrated samples.

Figure 27:
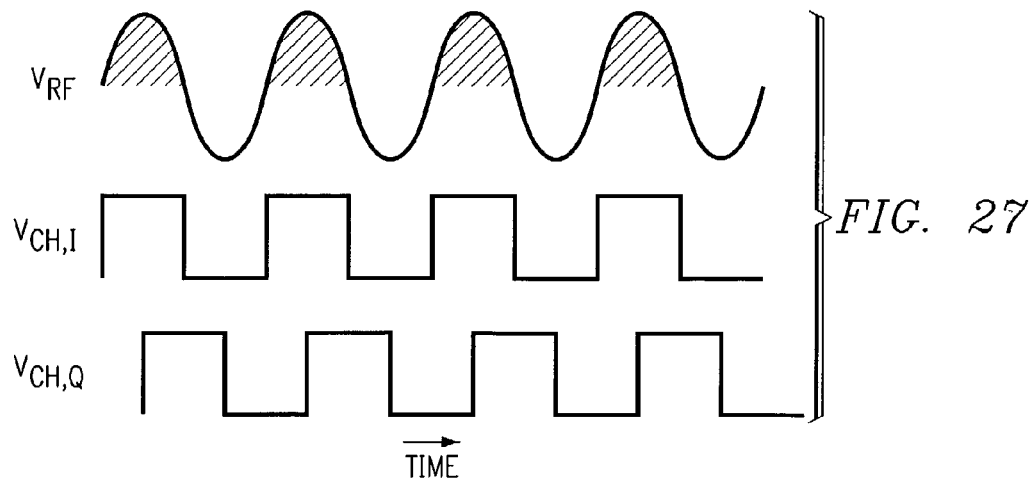
FIG. 27 graphically illustrates exemplary control signals which can be used in the embodiments of FIG. 26.

FIG. 26 diagrammatically illustrates exemplary embodiments of the invention that can perform I/Q mixing. Two separate (e.g. current mirrored) LNTA outputs are provided. Each LNTA output drives two sampling capacitors, one associated with an input (non-inverting or inverting) of the I phase differential amplifier, and one associated with the corresponding input (non-inverting or inverting) of the Q phase differential amplifier. Examples of the signals ($V_{Ch,I}$ and $\nabla_{Ch,I}$ and $V_{Ch,Q}$ and $\nabla_{Ch,Q}$) that control the sampling capacitors of FIG. 26 are shown graphically in FIG. 27. As shown in FIG. 27, the I phase control signal $V_{Ch,I}$ is in phase with the RF waveform $V_{RF}$, and the Q phase control signal $V_{Ch,Q}$ is phase shifted by 90°.

Figure 4A:
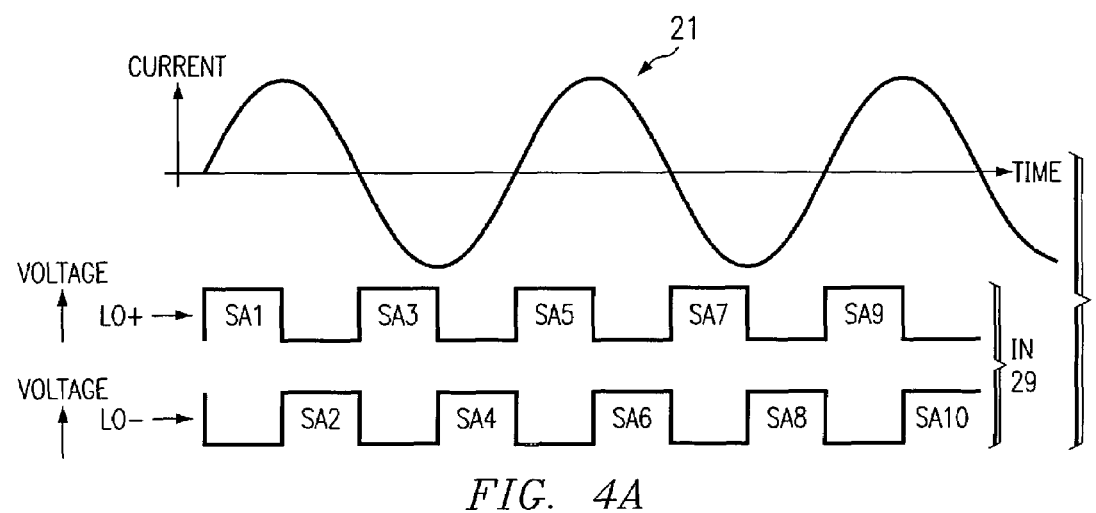

Although half cycles of the current waveform 21 are integrated in the exemplary embodiments described above, it will be evident to workers in the art that any of the above-described embodiments can be implemented such that fractional cycles of any desired size are integrated. As an example, FIG. 4A is generally similar to FIG. 4, but illustrates a situation where each sample SA1, SA2, . . . corresponds to integration of a quarter cycle of the current waveform 21. Exemplary embodiments which implement the quarter cycle integration illustrated in FIG. 4A can, for example, utilize two sampling stages (or two banks of sampling stages) where only a single sampling stage (or a single bank of stages) is used in the above-described embodiments that use half cycle integration. This can be seen by comparing the example of FIG. 5, which integrates half cycles (see also FIG. 4), with the example of FIG. 5B, which is generally similar to FIG. 5 but integrates quarter cycles (see also FIG. 4B).

Note that any suitable charge transfer technology can be used to support the exemplary embodiments described herein. In the exemplary embodiments described above, voltage is converted to current, which is integrated on sampling capacitors, and the resulting charge is manipulated to perform filtering. However, any technology which permits sampling the area under the RF carrier half periods and then manipulating these samples can be used.

It will be apparent to workers in the art that the digitally controlled filtering technique described above can reduce the dynamic range requirements of subsequent stages in the analog front end. By appropriate control of the DCU bus lines, an arbitrary decimating FIR filter function can be realized. Multi-bit coefficient resolution can be obtained in a direct sampling mixer. The invention provides digital controls for an FIR filter, which can be used to provide a programmable transfer function through a DSP core or other microcontroller/microprocessor. The FIR filter permits rejection of unwanted energy, thereby reducing the dynamic range of subsequent components in the signal path. This has the potential of reducing the power dissipation while providing programmability of the signal path immediately after the LNTA. The invention can be used, for example, to provide a highly integrated RF front end design in deep submicron CMOS technology at a relatively low cost. The invention is also readily applicable to technologies other than CMOS. The disclosed sampling in the current domain provides a high degree of tolerance of timing jitter in the sampling clock. The invention also provides high linearity in a subsampling receiver architecture because the filter transfer function(s) can be designed to ensure that the sampling switches can be operated in their linear region of operation during the sampling process.

The invention provides further exemplary advantages, such as the ability to combine charges from different samples to obtain filtering, the ability to mix an RF signal to IF by controlling the amount of time that the RF waveform is integrated on the sampling capacitor, the ability to mix by commutation (that is, inverting the odd samples and combining them with even samples). Other exemplary advantages include a simple design and robustness.

Although exemplary embodiments of the invention are described above in detail, this does not limit the scope of the invention, which can be practiced in a variety of embodiments.

What is claimed is:

1. An apparatus for downconverting a first periodic voltage waveform into a second periodic voltage waveform, comprising:
   an input for receiving the first voltage waveform;
   a sampler having a control input for receiving a control signal indicative of a code used to produce the first voltage waveform, said sampler coupled to said first-mentioned input, and said sampler responsive to said control signal for obtaining from the first voltage waveform a plurality of temporally distinct samples respectively indicative of areas under corresponding fractional-cycles of the first voltage waveform wherein said fractional cycles are one of half cycles and quarter cycles; and
   a combiner coupled to said sampler for combining the samples to produce the second voltage waveform.

2. The apparatus of claim 1, wherein said code includes a sequence of code symbols.

3. The apparatus of claim 2, wherein said code is a pseudo-noise code.

4. The apparatus of claim 2, wherein said code is a spreading code and the first voltage waveform is a spread spectrum signal.

5. The apparatus of claim 4, wherein said spreading code is a CDMA spreading code and the first voltage waveform is a CDMA signal.

6. The apparatus of claim 2, wherein said sampler is operable for associating said samples with respective code symbols of said sequence.

7. An apparatus for downconverting a first periodic voltage waveform into a second periodic voltage waveform, comprising:
   an input for receiving the first voltage waveform;
   a sampler having a control input for receiving a control signal indicative of a code used to produce the first voltage waveform, said sampler coupled to said first-mentioned input, and said sampler responsive to said control signal for obtaining from the first voltage waveform a plurality of temporally distinct samples respectively indicative of areas under corresponding fractional-cycles of the first voltage waveform, wherein said sampler is operable for associating said samples with respective code symbols of said sequence and includes a transconductance amplifier for transforming the first voltage waveform into a corresponding current waveform, and a plurality of capacitors coupled to said transconductance amplifier for integrating fractional-cycles of the current waveform; and a combiner coupled to said sampler for combining the samples to produce the second voltage waveform.

8. The apparatus of claim 7, wherein said sampler is operable for using each said fractional-cycle of the current waveform to charge a corresponding one of said capacitors.

9. The apparatus of claim 8, wherein said sampler is operable for using one of the fractional-cycles of the current waveform to charge a group of said capacitors.

10. The apparatus of claim 9, wherein said combiner is operable for dumping charge from different ones of said group of capacitors during respectively different periods of time.

11. The apparatus of claim 8, wherein said combiner is operable for simultaneously dumping charge from a group of said capacitors that have been charged by respective ones of said fractional-cycles of the current waveform.

12. The apparatus of claim 8, wherein said sampler is operable for using a plurality of the fractional-cycles of the current waveform to charge one of said capacitors.

13. The apparatus of claim 12, wherein said sampler is operable for using respective pluralities of the fractional-cycles of the current waveform to charge respective ones of a group of said capacitors.

14. The apparatus of claim 13, wherein said combiner is operable for simultaneously dumping charge from said group of capacitors.

15. The apparatus of claim 1, including a control signal generator coupled to said control input of said sampler for providing thereto said control signal, said control signal generator for producing said control signal based on said code and an information-carrying waveform used in combination with said code to produce the first voltage waveform.

16. The apparatus of claim 15, wherein said control signal generator is operable for combining said code with a complex conjugate of the information-carrying waveform.

17. A method of downconverting a first periodic voltage waveform into a second periodic voltage waveform, comprising:

providing a control signal indicative of a code used to produce the first voltage waveform;

in response to said control signal, obtaining from the first voltage waveform a plurality of temporally distinct samples respectively indicative of areas under corresponding fractional-cycles of the first voltage waveform wherein said fractional cycles are one of half cycles and quarter cycles; and combining the samples to produce the second voltage waveform.

18. The method of claim 17, wherein said code includes a sequence of code symbols.

19. The method of claim 18, wherein said code is a pseudo-noise code.

20. The method of claim 18, wherein said code is a spreading code and the first voltage waveform is a spread spectrum signal.

21. The method of claim 20, wherein said spreading code is a CDMA spreading code and the first voltage waveform is a CDMA signal.

22. The method of claim 18, wherein said obtaining step includes associating said samples with respective code symbols of said sequence.

23. A method of downconverting a first periodic voltage waveform into a second periodic voltage waveform, comprising:

providing a control signal indicative of a code used to produce the first voltage waveform, said code including a sequence of code symbols;

in response to said control signal, obtaining from the first voltage waveform a plurality of temporally distinct samples respectively indicative of areas under corresponding fractional-cycles of the first voltage waveform, including associating said samples with respective code symbols of said sequence and transforming the first voltage waveform into a corresponding current waveform, and integrating fractional-cycles of the current waveform; and combining the samples to produce the second voltage waveform.

24. The method of claim 23, wherein said integrating step includes using each said fractional-cycle of the current waveform to charge a corresponding capacitor.

25. The method of claim 24, wherein said using step includes using one of the fractional-cycles of the current waveform to charge a plurality of capacitors.

26. The method of claim 25, wherein said combining step includes dumping charge from different ones of said plurality of capacitors during respectively different periods of time.

27. The method of claim 24, wherein said combining step includes simultaneously dumping charge from a plurality of capacitors that have been charged by respective ones of said fractional-cycles of the current waveform.

28. The method of claim 24, wherein said using step includes using a plurality of the fractional-cycles to charge a single capacitor.

29. The method of claim 28, wherein said last-mentioned using step includes using respective pluralities of the fractional-cycles to charge respective capacitors.

30. The method of claim 29, wherein said combining step includes simultaneously dumping charge from the respective capacitors.

31. The method of claim 17, including producing said control signal based on said code and an information-carrying waveform used in combination with said code to produce the first voltage waveform.

32. The method of claim 31, wherein said producing step includes combining said code with a complex conjugate of said information-carrying waveform.

33. The method of claim 17, wherein the first voltage waveform is an RF waveform.

34. A communication receiving apparatus, comprising:

an input for receiving a communication signal formed as a first periodic voltage waveform;

a mixer coupled to said input for down converting the first periodic voltage waveform into a second periodic voltage waveform, including a sampler having a control input for receiving a control signal indicative of a code used to produce the first voltage waveform, said sampler responsive to said control signal for obtaining from the first voltage waveform a plurality of temporally distinct samples respectively indicative of areas under corresponding fractional-cycles of the first voltage waveform and a combiner coupled to said sampler for combining the samples to produce the second voltage waveform, wherein said fractional cycles are one of half cycles and quarter cycles, and a signal processing portion coupled to said mixer for receiving and processing the second voltage waveform.

35. The apparatus of claim 34, wherein said communication signal is an RF communication signal.

36. The apparatus of claim 34, wherein said code includes a sequence of code symbols.

37. The apparatus of claim 36, wherein said code is a pseudo-noise code.

38. The apparatus of claim 36, wherein said code is a spreading code and the first voltage waveform is a spread spectrum signal.

39. The apparatus of claim 38, wherein said spreading code is a CDMA spreading code and the first voltage waveform is a CDMA signal.

40. A communication receiving apparatus, comprising:

an input for receiving a communication signal formed as a first periodic voltage waveform;

a mixer coupled to said input for down converting the first periodic voltage waveform into a second periodic voltage waveform, including a sampler having a control input for receiving a control signal indicative of a code used to produce the first voltage waveform, said sampler responsive to said control signal for obtaining from the first voltage waveform a plurality of temporarily distinct samples respectively indicative of areas under corresponding fractional-cycles of the first voltage waveform, and a combiner coupled to said sampler for combining the samples to produce the second voltage waveform; and a signal processing portion coupled to said mixer for receiving and processing the second voltage waveform, said signal processing portion including an analog signal processing portion, a baseband digital signal processing portion, and an analog-to-digital converter connected therebetween.

* * * * *